United States Patent
Lilak et al.

(10) Patent No.: US 11,605,556 B2
(45) Date of Patent: Mar. 14, 2023

(54) BACK SIDE PROCESSING OF INTEGRATED CIRCUIT STRUCTURES TO FORM INSULATION STRUCTURE BETWEEN ADJACENT TRANSISTOR STRUCTURES

(71) Applicant: INTEL CORPORATION, Santa Clara, CA (US)

(72) Inventors: Aaron D. Lilak, Beaverton, OR (US); Rishabh Mehandru, Portland, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/473,902

(22) PCT Filed: Mar. 30, 2017

(86) PCT No.: PCT/US2017/024996
§ 371 (c)(1),
(2) Date: Jun. 26, 2019

(87) PCT Pub. No.: WO2018/182611
PCT Pub. Date: Oct. 4, 2018

(65) Prior Publication Data
US 2019/0341297 A1   Nov. 7, 2019

(51) Int. Cl.
*H01L 21/762* (2006.01)
*H01L 21/8234* (2006.01)
(Continued)

(52) U.S. Cl.
CPC .. *H01L 21/76289* (2013.01); *H01L 21/76283* (2013.01); *H01L 21/823481* (2013.01);
(Continued)

(58) Field of Classification Search
CPC ......... H01L 21/76289; H01L 21/76283; H01L 21/823481; H01L 27/1211;
(Continued)

(56) References Cited

U.S. PATENT DOCUMENTS 8,753,934 B2   6/2014   Kanakasabapathy et al.
8,901,537 B2   12/2014   Murthy et al.
(Continued)

FOREIGN PATENT DOCUMENTS

WO   2018182611 A1   10/2018

OTHER PUBLICATIONS

International Search Report and Written Opinion recieved for PCT Application No. PCT/US2017/024996, dated Dec. 22, 2017. 12 pages.

(Continued)

*Primary Examiner* — Patricia D Valenzuela
(74) *Attorney, Agent, or Firm* — Schwabe, Williamson & Wyatt, P.C.

(57) ABSTRACT

Techniques are disclosed for forming integrated circuit structures having a plurality of non-planar transistors. An insulation structure is provided between channel, source, and drain regions of neighboring fins. The insulation structure is formed during back side processing, wherein at least a first portion of the isolation material between adjacent fins is recessed to expose a sub-channel portion of the semiconductor fins. A spacer material is then deposited at least on the exposed opposing sidewalls of the exposed sub-channel portion of each fin. The isolation material is then further recessed to form an air gap between gate, source, and drain regions of neighboring fins. The air gap electrically isolates the source/drain regions of one fin from the source/drain regions of an adjacent fin, and likewise isolates the gate (Continued)

region of the one fin from the gate region of the adjacent fin. The air gap can be filled with a dielectric material.

23 Claims, 15 Drawing Sheets

(51) Int. Cl.
H01L 27/12 (2006.01)
H01L 29/10 (2006.01)
H01L 29/66 (2006.01)

(52) U.S. Cl.
CPC .. H01L 27/1211 (2013.01); *H01L 21/823431* (2013.01); *H01L 29/1037* (2013.01); *H01L 29/6656* (2013.01)

(58) Field of Classification Search
CPC ......... H01L 21/823431; H01L 29/7848; H01L 29/78696; H01L 29/66545; H01L 27/0924; H01L 21/823821; H01L 21/76224; H01L 21/762; H01L 29/6656; H01L 29/1037
See application file for complete search history.

(56) References Cited

U.S. PATENT DOCUMENTS

| | | | |
|---|---|---|---|
| 9,117,791 B2 | 8/2015 | Glass et al. | |
| 9,209,274 B2* | 12/2015 | Zschaetzsch | H01L 29/66553 |
| 9,343,559 B2 | 5/2016 | Glass et al. | |
| 9,368,572 B1* | 6/2016 | Cheng | H01L 27/1248 |
| 9,437,691 B2 | 9/2016 | Glass et al. | |
| 9,484,432 B2* | 11/2016 | Glass | H01L 21/76895 |
| 9,748,359 B1* | 8/2017 | Gluschenkov | H01L 29/42392 |
| 10,043,900 B1* | 8/2018 | Bi | H01L 29/785 |
| 2007/0134864 A1 | 6/2007 | Anderson et al. | |
| 2008/0029834 A1* | 2/2008 | Sell | H01L 29/4983 257/411 |
| 2013/0005129 A1* | 1/2013 | Kanakasabapathy | H01L 27/1211 438/589 |
| 2013/0109152 A1* | 5/2013 | Huang | H01L 29/7853 438/430 |
| 2014/0027860 A1 | 1/2014 | Glass et al. | |
| 2014/0159167 A1* | 6/2014 | Basker | H01L 29/785 257/410 |
| 2014/0299945 A1* | 10/2014 | Huang | H01L 21/02636 257/408 |
| 2015/0279933 A1* | 10/2015 | Xiao | H01L 21/306 257/400 |
| 2016/0204146 A1* | 7/2016 | Wei | H01L 27/14685 257/432 |
| 2016/0322501 A1* | 11/2016 | Cheng | H01L 29/165 |
| 2017/0133286 A1* | 5/2017 | Sung | H01L 21/823814 |
| 2017/0141108 A1* | 5/2017 | Chang | H01L 29/0638 |
| 2018/0006036 A1* | 1/2018 | Cheng | H01L 29/66795 |
| 2018/0012839 A1* | 1/2018 | Zang | H01L 21/845 |

OTHER PUBLICATIONS

International Preliminary Report on Patentability recieved for PCT Application No. PCT/US2017/024996, dated Oct. 1, 2019. 8 pages.

* cited by examiner

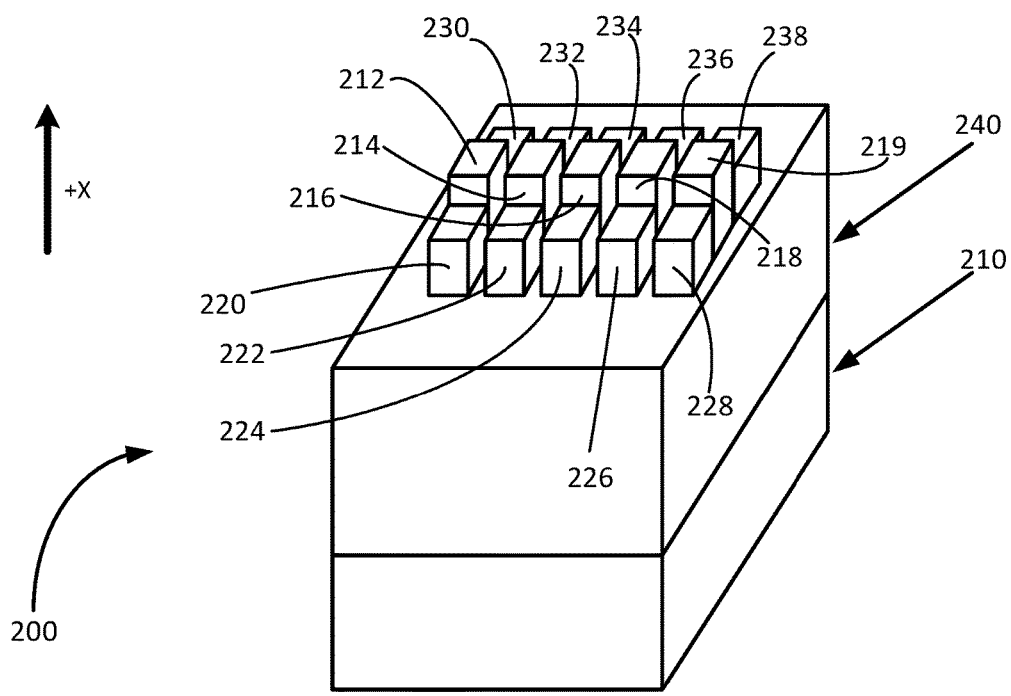
FIG. 2A
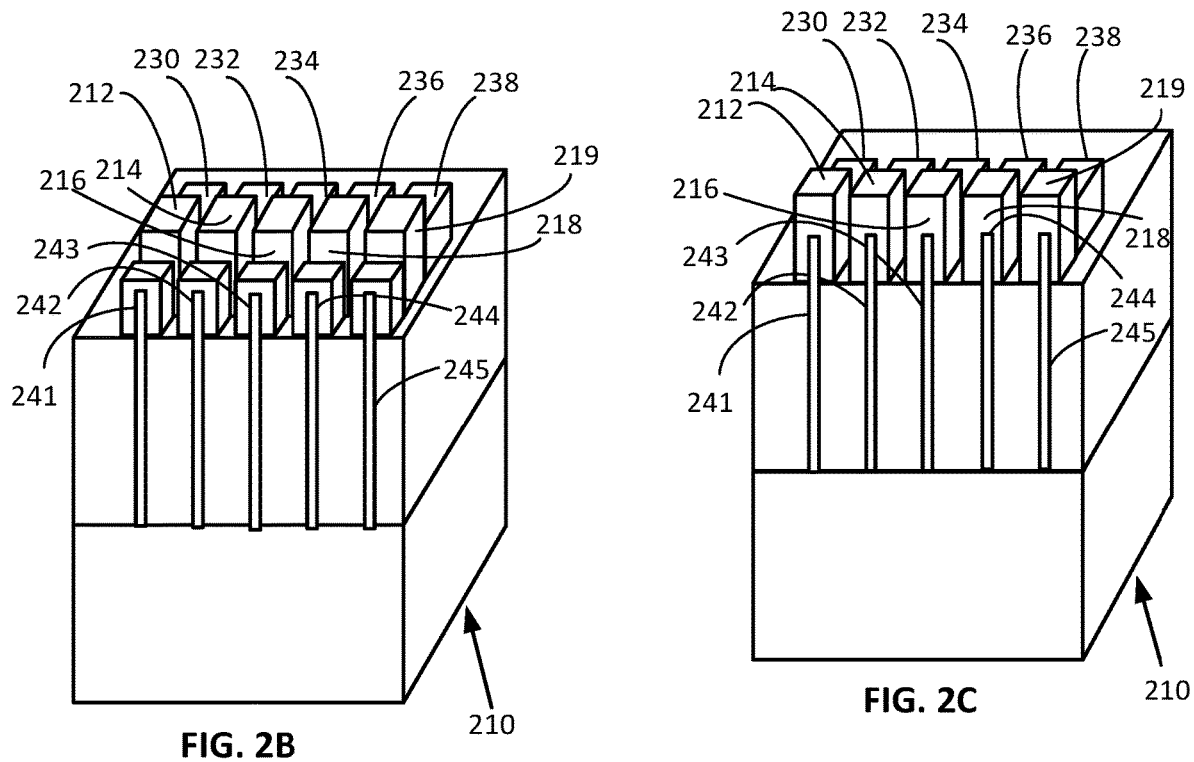
FIG. 2B
FIG. 2C

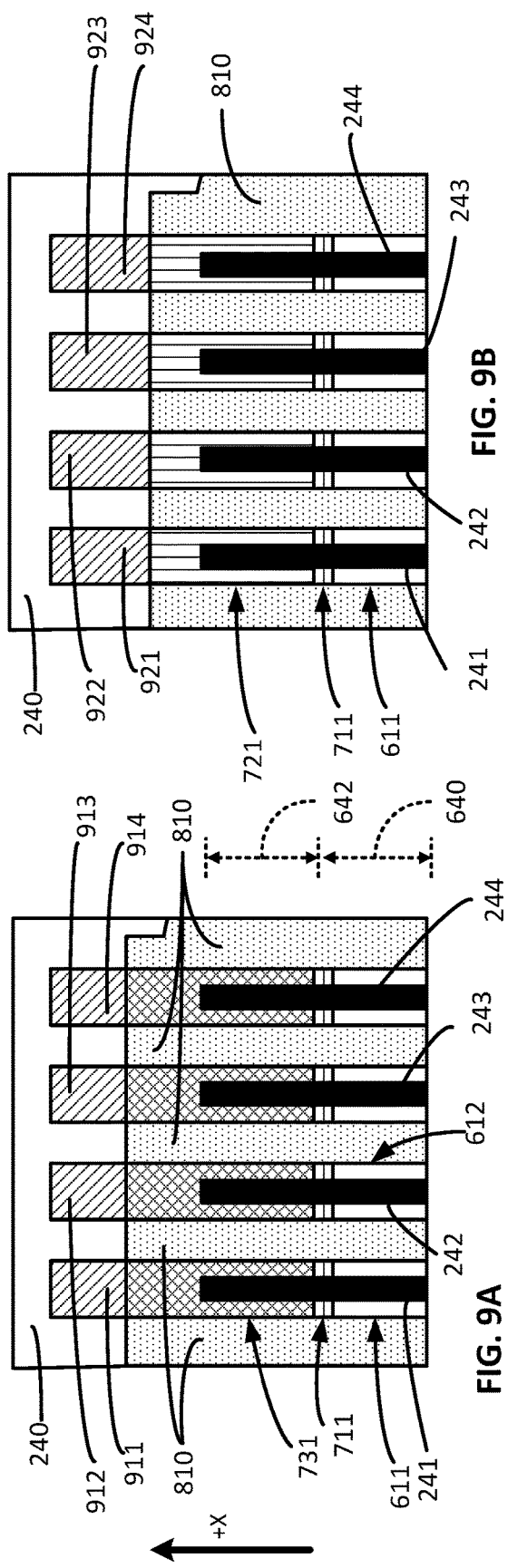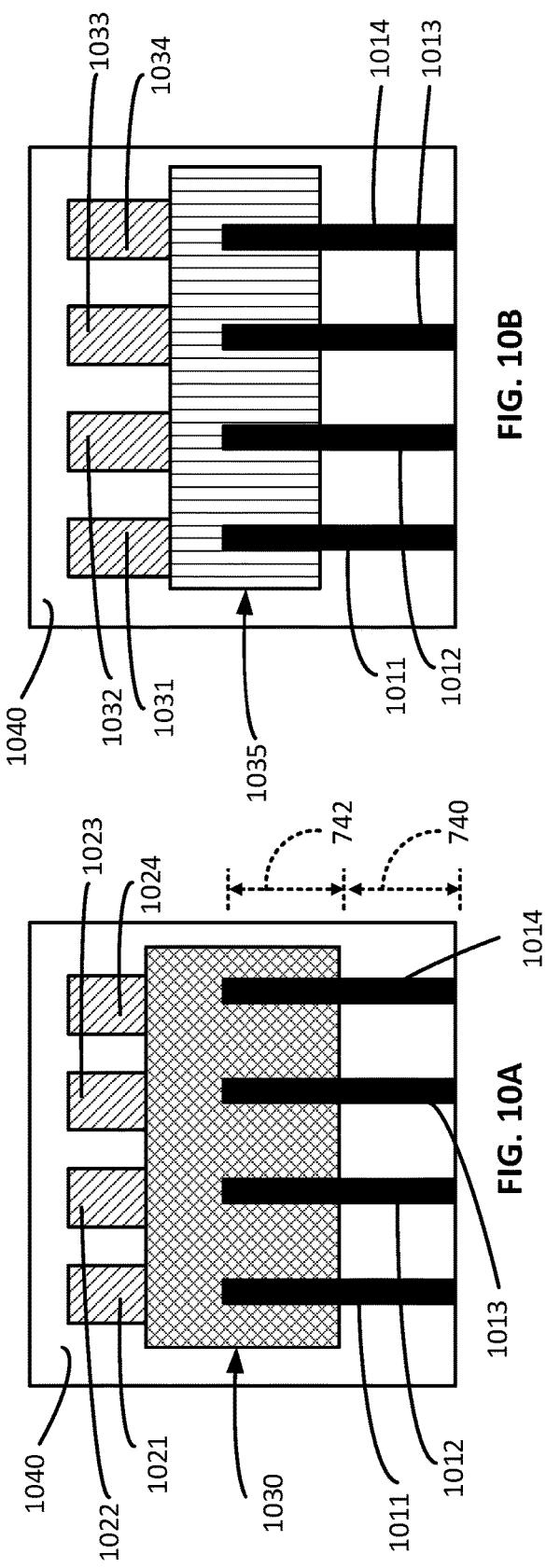

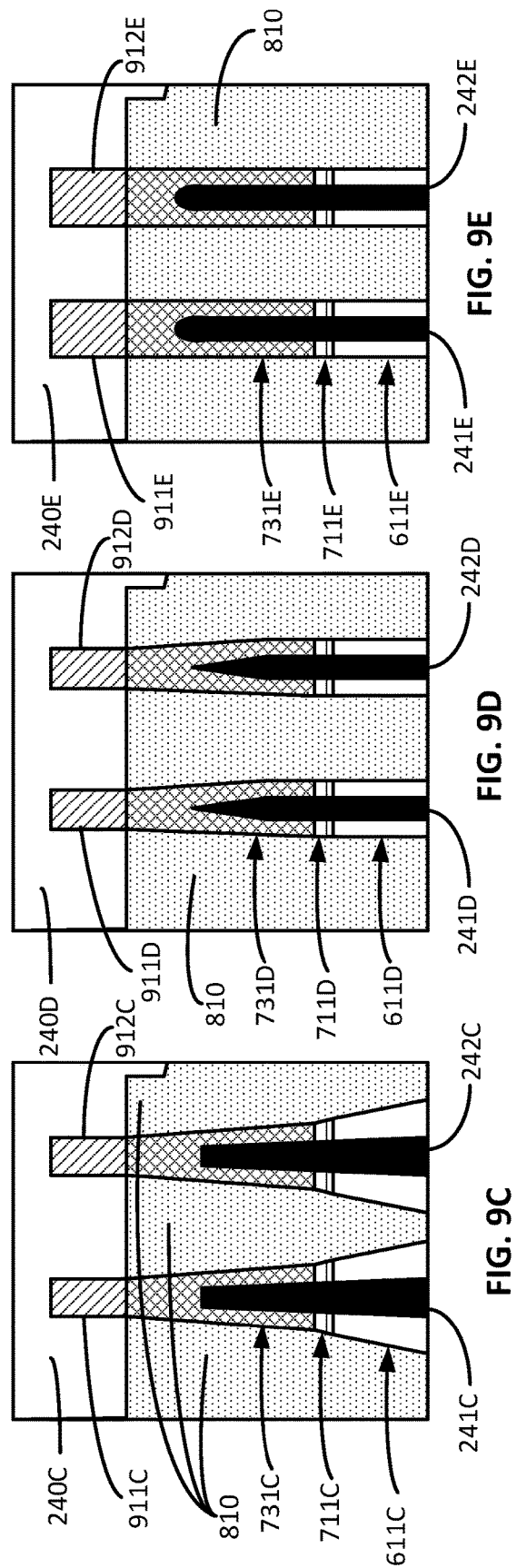

US 11,605,556 B2

BACK SIDE PROCESSING OF INTEGRATED CIRCUIT STRUCTURES TO FORM INSULATION STRUCTURE BETWEEN ADJACENT TRANSISTOR STRUCTURES

CROSS-REFERENCE TO RELATED APPLICATIONS

This patent application is a U.S. National Phase Application under 35 U.S.C. § 371 of International Application No. PCT/US2017/024996, filed on Mar. 30, 2017, the entire contents of which is hereby incorporated by reference herein.

BACKGROUND

Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include side-wall or so-called gate spacers on either side of the gate that can help determine the channel length and can help with replacement gate processes, for example. Complementary MOS (CMOS) structures typically use a combination of p-type MOSFETs (p-MOS) and n-type MOSFETs (n-MOS) to implement logic gates and other digital circuits.

A FinFET is a transistor built around a thin strip of semiconductor material (generally referred to as a fin). The transistor includes the standard FET nodes, including a gate, a gate dielectric, a source region, and a drain region. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Tri-gate transistors are one example of non-planar transistor configurations, and other types of non-planar configurations are also available, such as so-called double-gate transistor configurations, in which the conductive channel principally resides only along the two sidewalls of the fin (and not along the top of the fin). Another non-planar transistor configuration is a gate-all-around configuration, which is configured similarly to a fin-based transistor, but instead of a finned channel region where the gate is on three portions (and thus, there are three effective gates), one or more nanowires (or nanoribbons) are used and the gate material generally surrounds each nanowire.

BRIEF DESCRIPTION OF THE DRAWINGS

FIG. 2A illustrates an example perspective view of an integrated circuit structure after completion of a first type of front end processing to produce a plurality of non-planar transistor devices each having a source region, a drain region, and a gate region, in accordance with an embodiment of the present disclosure.

FIG. 2B illustrates an example cross-sectional view as taken through a source region or a drain region of the integrated circuit structure of FIG. 2A, in accordance with an embodiment of the present disclosure.

FIG. 2C illustrates an example cross-sectional view as taken through a gate region of the integrated circuit structure of FIG. 2A, in accordance with an embodiment of the present disclosure.

FIG. 9A illustrates an example cross-sectional view taken through the gate region of the integrated circuit structure of FIG. 8, in accordance with an embodiment of the present disclosure. The cross-section is taken perpendicular to the fin and through the gate region.

FIG. 9B illustrates an example cross-sectional view taken through the source or drain region of the integrated circuit structure of FIG. 8, in accordance with an embodiment of the present disclosure. The cross-section is taken perpendicular to the fin and through the source or drain region.

FIGS. 9C-9H each illustrate an example cross-sectional view of an integrated circuit structure configured with a transistor including a spacer material surrounding a full perimeter of the sub-channel portion of the fin, in accordance with an embodiment of the present disclosure. The cross-sections are taken perpendicular to the fin and through the gate region.

FIG. 10A illustrates an example cross-sectional view taken through the gate of an integrated circuit where the gate regions for adjacent transistor devices have merged together, in the comparative case where back side processing has not been performed. The cross-sectional view is taken perpendicular to the fin and through the gate region.

FIG. 10B illustrates an example cross-sectional view taken through the source or drain region of the integrated circuit where the source or drain regions for adjacent transistor devices have merged together, in the comparative case where back side processing has not been performed. The cross-sectional view is taken perpendicular to the fin and through the source or drain region.

Figure 1A:
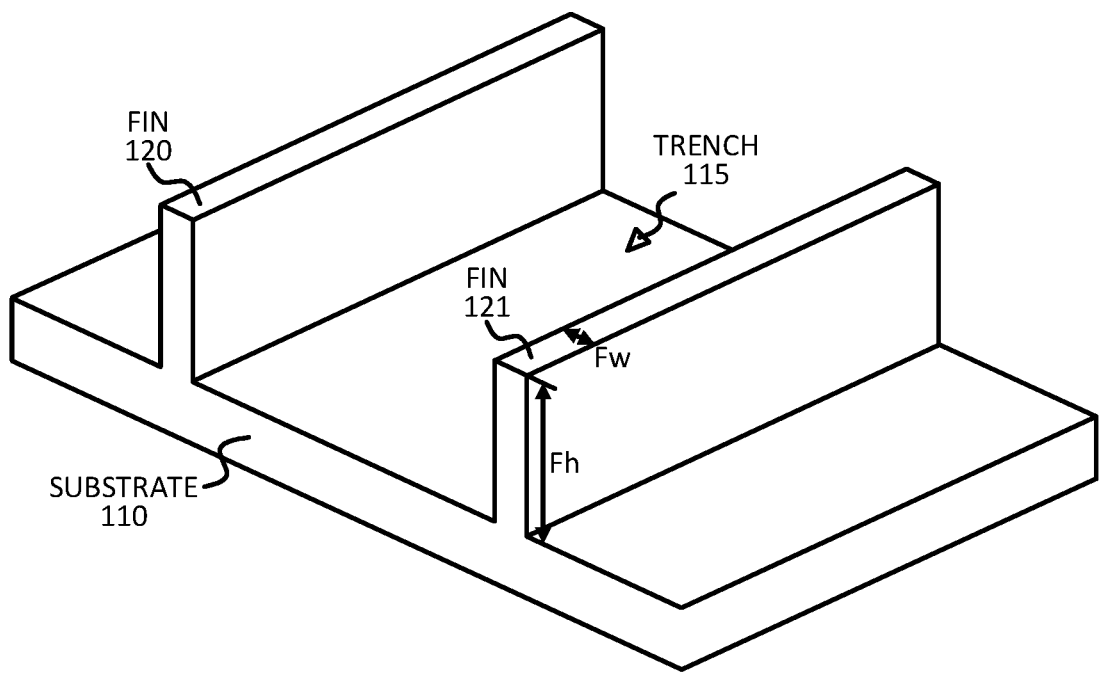
FIGS. 1A-1G illustrate example perspective views of integrated circuit structures resulting from a method configured to form non-planar transistors, in accordance with some embodiments of the present disclosure.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming integrated circuit structures having a plurality of semiconductor fins that form transistors. The integrated circuit structure includes an insulation structure between the channel, source, and drain regions of neighboring fins. The insulation structure is formed during a back side processing and electrically isolates adjacent transistor devices in the channel, source, and drain regions of neighboring fins of the integrated circuit structure. After completion of front end processing of the integrated circuit structure where fins are formed on (or from) an initial substrate, the integrated circuit structure can be rotated 180-degrees (flipped over) to access a back side of the integrated circuit structure. The initial substrate is then removed, and the back side of the semiconductor fins are visible. From the back side of the integrated circuit structure, at least a first portion of the isolation material between adjacent fins is recessed to expose a sub-channel portion of the semiconductor fins. A spacer material is then deposited around a full perimeter (or at least on the exposed opposing sidewalls) of the exposed sub-channel portion of each of the semiconductor fins. The isolation material is then further recessed to form an air gap between the source regions of neighboring fins and between the drain regions of neighboring fins. The spacers protect the fin during the further recessing of the back side of the integrated circuit structure and serve to offset the etch process from the source and drain or gate regions of the assembly, thereby allowing for some region of metal or contact material to remain surrounding the fin. Another purpose of the spacers is to allow for the etch to occur without completely removing the epitaxial layers surrounding the source or drain region or the gate stack surrounding the gate, as will be appreciated in light of the present disclosure. The width of the spacer determines the width of the remaining source or gate region or of the gate stack material, in accordance with an embodiment of the present disclosure. The air gap electrically isolates the source or drain region of one fin from the source or drain region of an adjacent fin, and likewise isolates the gate region of the one fin from the gate region of the adjacent fin. In some embodiments, the air gap can be filled with a low-k dielectric material, although other suitable dielectric materials can be used as well. Forming the insulation structure between adjacent transistor devices during the back side processing as provided herein effectively allows for mitigation of unintended merging in the source, drain and gate regions for adjacent transistor devices. Numerous configurations and variations will be apparent in light of this disclosure.

General Overview

Creating transistor devices having semiconductor fins that are very closely spaced is a challenge. This is particularly challenging as the distance between fins becomes smaller and the width of the fins becomes smaller, because the source, drain, and/or gate regions of adjacent transistor devices can merge together. This is particularly of issue for technologies which utilize epitaxial stressor regions in the source/drain of the device. This can result in devices that are not electrically isolated from each other and the transistor devices become independently inoperable. Complicating matters is that if insulator material is somehow disposed between the fins during front end fabrication, then that insulator material will need to survive the remainder of front end processing, which can be challenging given factors such as thermal budget constraints, etch rates of the various materials involved, and high stress levels involved with front-side processing. Moreover, the insulator material employed must be capable of being deposited between the fins.

Thus, and in accordance with one or more embodiments of the present disclosure, techniques are provided for forming transistor devices that are separated from each other during a back side processing of the transistor devices and after completion of front end processing. For example, after front end processing is completed, the integrated circuit structure is flipped over 180-degrees to reveal the back side of the integrated circuit structure. The initial substrate material upon which the fins were formed is removed to reveal a back side of the semiconductor fins. Isolation material (deposited during front end processing) between the semiconductor fins is recessed from the back side of the integrated circuit structure during a first removal to expose a sub-channel portion of the semiconductor fins. A spacer material is then deposited around a perimeter of the sub-channel portion of each of the exposed semiconductor fins. The spacer protects the semiconductor fins from a subsequent further recessing in the source, drain and gate regions. The further recessing is performed from the back side of the integrated circuit structure, which forms an air gap between the source regions of neighboring fins and the drain regions of neighboring fins. More specifically, an air gap is formed between the source region of a first fin and the source region of an adjacent second fin. Also, the air gap is formed between the drain region of the first fin and the drain region of the adjacent second fin. Likewise the air gap is formed between the gate region of the first fin and the gate region of the adjacent second fin. In some embodiments, a low-k dielectric material can be inserted in the air gap, or the air gap itself can be used to electrically isolate adjacent transistor devices. In still other embodiments, other dielectric materials can be used to fill the air gap, such as silicon dioxide, silicon nitride, or an organic polymer.

In some embodiments, the resulting structure includes a semiconductor fin having a channel portion and a sub-channel portion, with a gate structure over and in direct contact with the channel portion, a source region, and a drain region. The resulting structure can include a spacer around a full perimeter of the sub-channel portion of the semiconductor fin, and a low-k dielectric material or other suitable dielectric material in direct contact with the spacer, the source region, the drain region and the gate structure. In some embodiments, the semiconductor fin can comprise a group III-V semiconductor material, a group IV semiconductor material, a compound group IV material (such as SiGe or GeSn), a II-VI semiconductor or an amorphous semiconductor material such Indium Gallium Zinc Oxide (IGZO). These fins may be, for example, native fins of the substrate (i.e., fin made from the substrate). Alternatively, the fins can be replacement fins that are formed on the substrate such as through an aspect ratio trapping process, where native fins are recessed or otherwise removed and replaced with another semiconductor material (e.g., silicon germanium fins on a silicon or silicon dioxide substrate, or indium gallium arsenide fins on a gallium arsenide or silicon or silicon dioxide substrate). In some embodiments, the spacer material can be a carbide material or a nitride material, such as silicon nitride, and the source region and the drain region can each comprise silicon germanium. Other variations and configurations will be apparent in light of the present disclosure.

Methodology and Architecture—Front End Processing

FIGS. 1A-1G illustrate example integrated circuit structures resulting from a method configured to form an integrated circuit having a plurality of non-planar transistors, in accordance with some embodiments of this disclosure. Note that FIGS. 1A-1G are three-dimensional views, in accordance with some embodiments. The techniques depicted generally refer to front end processing techniques for fin and transistor device formation. The fins can be used, for example, to form p-type or n-type transistor devices, such as p-type MOSFET (p-MOS), n-type MOSFET (n-MOS), p-type tunnel FET (p-TFET), or n-type TFET (n-TFET), to name a few examples. Further, in some embodiments, the techniques may be used to benefit either or both of p-type and n-type transistors included in complementary MOS (CMOS) or complementary TFET (CTFET) devices, for example. Further yet, in some embodiments, the techniques may be used with devices of varying scales, such as transistor devices having critical dimensions in the micrometer range or in the nanometer range (e.g., transistors formed at the 32, 22, 14, 10, 7, or 5 nm process nodes, or beyond).

Reference is made to FIG. 1A, illustrating an example structure including substrate 110 having two fins 120, 121 extending therefrom, in accordance with an embodiment. The fins 120, 121 can be formed using any suitable technique, such as one or more patterning and etching processes, for example. In this example embodiment, fins 120 are native to the substrate 110, in that the fins 120 are formed on and from the substrate 110, with a trench 115 between fins. The fins 120, 121 may be formed by etching trenches 115 out of a bulk of substrate material 110 such as a bulk silicon substrate, for example. In other embodiments, the fins 120 are so-called replacement fins that are not native to the substrate 110, but instead are fins deposited onto the substrate 110 within relatively deep trenches previously occupied by placeholder fins native to the substrate, via an aspect ratio trapping process. In some such cases, the fins are formed as multilayer stacks of different materials, to facilitate later formation of nanowires during a gate last process. Example replacement fin forming techniques are provided, for instance, in U.S. Patent Application Publication No. 2014/0027860 and U.S. Pat. No. 9,343,559. Regardless of whether they are native to the substrate or not (and whether they are configured as continuous fins or multilayer stacks), the fins may be formed to have varying widths Fw and heights Fh. For example, the height to width ratio (h:w) of the fins is generally greater than 1, such as greater than 1.5, 2, 3, 5, 10, 15, 20, 30, or higher, or any other suitable minimum ratio. The length of the fins may of course also vary as well, but is typically longer than the widest width of the given fin. Note that while the fins are shown with relatively straight sides and a flat top, in reality the fins may have angled or tapered sidewalls such that the width Fw at the base of the fin is wider than the width Fw at the top of the fin. Likewise, the fin tops may actually be rounded, trapezoidal, or otherwise not perfectly flat. Numerous fin shapes and dimensions can be used in accordance with an embodiment of the present disclosure, and the present disclosure is not intended to be limited to any particular range of fin geometries. Further note that although only two fins are shown in the example structure of FIG. 1A for illustrative purposes, any number of fins may be formed, such as one, five, ten, hundreds, thousands, and so forth, depending on the end use or target application. Further note that the fins are shown as being spaced relatively far apart for ease of illustration. However, as will be appreciated in light of this disclosure, the fins can be very closely spaced, within a few nanometers of each other, according to some embodiments.

In some embodiments, substrate 110 may include: a bulk substrate including a group IV material or compound, such as silicon (Si), germanium (Ge), silicon carbide (SiC), or silicon germanium (SiGe); an X on insulator (XOI) structure where X is one of the aforementioned group IV materials and the insulator material is a native oxide material or some other electrically insulating material; or some other suitable multilayer structure where the top layer includes one of the aforementioned group IV materials. In still other embodiments, the substrate may comprise bulk or XOI configurations comprising group III-V compound materials, such as gallium arsenide and indium gallium arsenide. In a more general sense, any suitable substrate can be used, as will be appreciated.

Figure 1B:
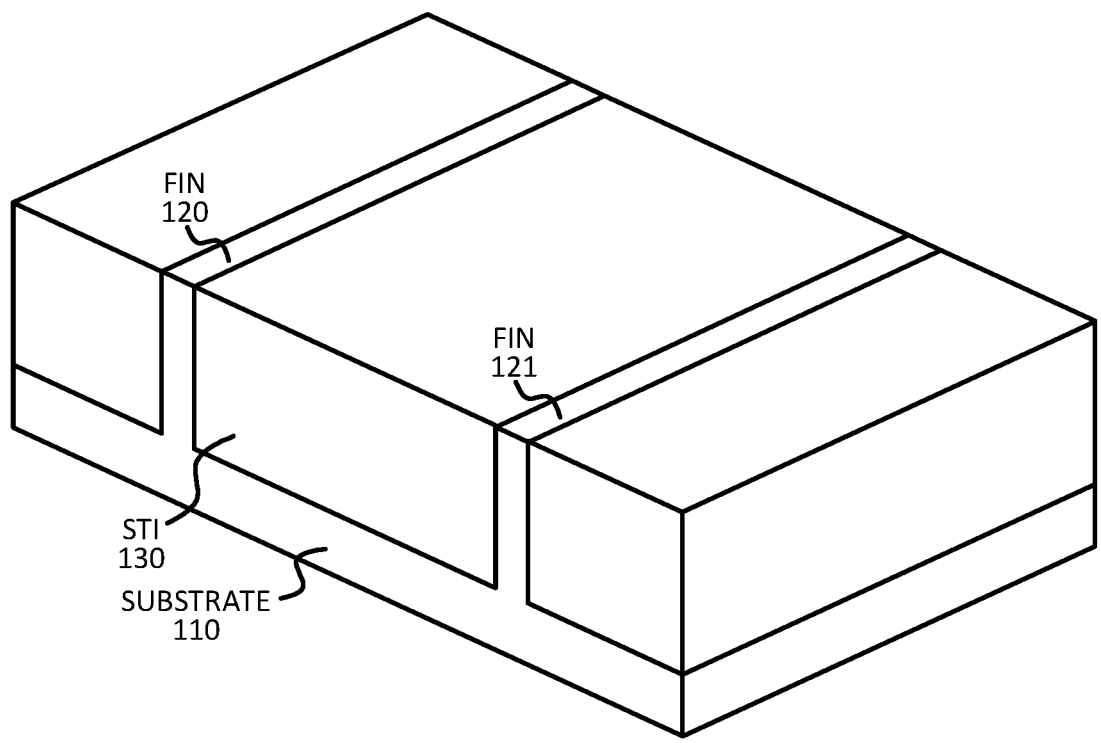

FIG. 1B illustrates an example structure formed after shallow trench isolation (STI) 130 processing has been performed in trenches 115 of the structure of FIG. 1A and structure has been planarized, in accordance with an embodiment. Any suitable deposition process may be used for the STI 130 deposition and the STI material may be selected based on the material of substrate 110 (e.g., to provide appropriate isolation and/or passivation), in some embodiments. For example, in the case of a Si substrate 110, STI material 110 may selected to be silicon dioxide ($SiO_2$), a spin-on or flowable nitride or oxynitride, or silicon nitride (SiN), in accordance with an example embodiment of the present disclosure.

Figure 1C:
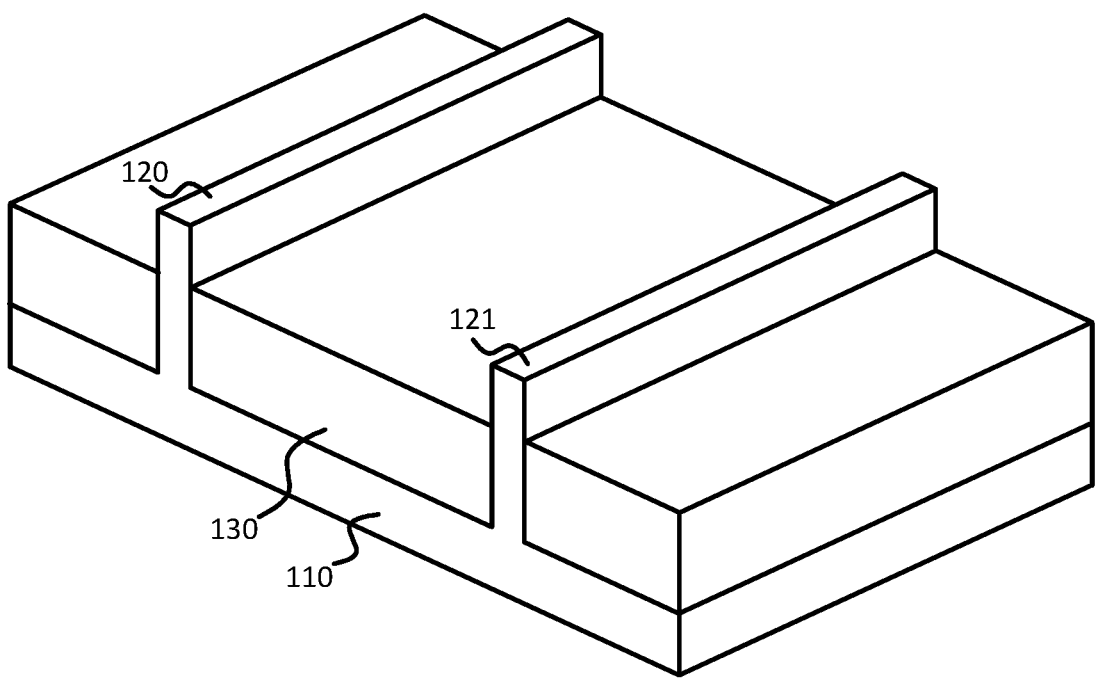

FIG. 1C illustrates an example structure formed after the STI material 130 has been partially recessed to expose a channel portion of the fins 120, 121, in accordance with an embodiment of the present disclosure. The STI material 130 is recessed to a depth, such that at least a portion of the sub-fin is below the recessed plane of the STI material 130. Recessing the STI material 130 may be performed using any suitable technique, including wet and/or dry etches selective to the fin materials (i.e., the STI material 130 etches faster than the fin 120, 121 materials). In some other embodiments, a masking scheme is used to protect the fin 120, 121 materials while the STI material 130 is recessed. In this example embodiment, STI material 130 is recessed such that 10 nm to 80 nm of the fins 120, 121 are exposed; however, in other embodiments, the STI material 130 may be recessed to a different depth.

Figure 1D:
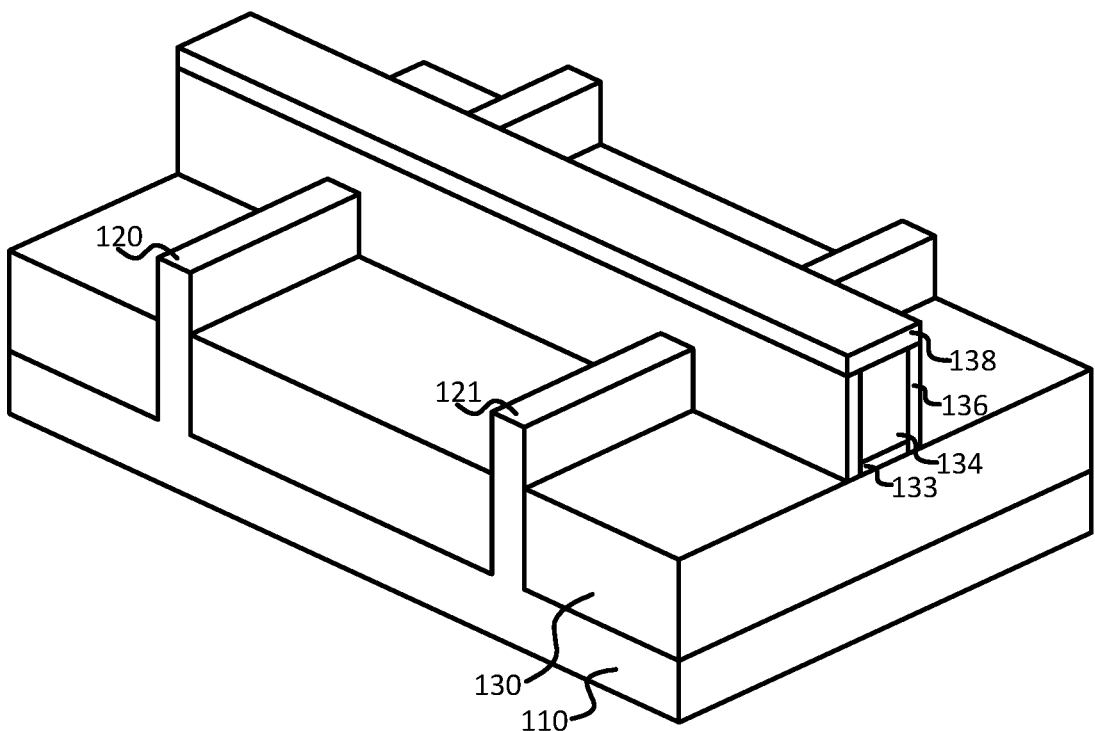

FIG. 1D illustrates an example structure formed after a gate stack has been formed on the structure of FIG. 1C, in accordance with an embodiment. In some such example embodiments, gate dielectric 133 and gate electrode 134 are dummy materials (e.g., silicon dioxide for the gate dielectric 133 and poly-silicon for the gate electrode 134) used in a gate last process flow. As will be discussed with reference to FIGS. 1F and 1G, the dummy materials may be subsequently removed later in the process and replaced with the final desired gate dielectric and gate electrode materials. Such a gate last process can be used, for example, to allow for processing in the channel region of the structure to form one or more nanowires, or otherwise manipulate the channel configuration as desired. Formation of the dummy gate stack may include depositing the dummy gate dielectric material 133, dummy gate electrode material 134, patterning the dummy gate stack (e.g., mask gate stack and etch excess dummy gate materials away), depositing gate spacer material 136 as well as a gate hardmask 138, and performing a spacer etch to form the structure shown in FIG. 1D, for example. Alternatively, a gate first process can be employed, using similar processing steps with the final desired gate materials rather than dummy gate materials. Example dummy gate materials include, for instance, silicon dioxide for the gate dielectric 133 and polysilicon for the dummy gate electrode 134. Example final gate materials will be discussed with reference to FIG. 1G. The example structure in this embodiment further includes hardmask 138 over the gate stack, which may be included to protect the dummy gate stack (or final gate stack, as the case may be) during subsequent processing.

Figure 1E:
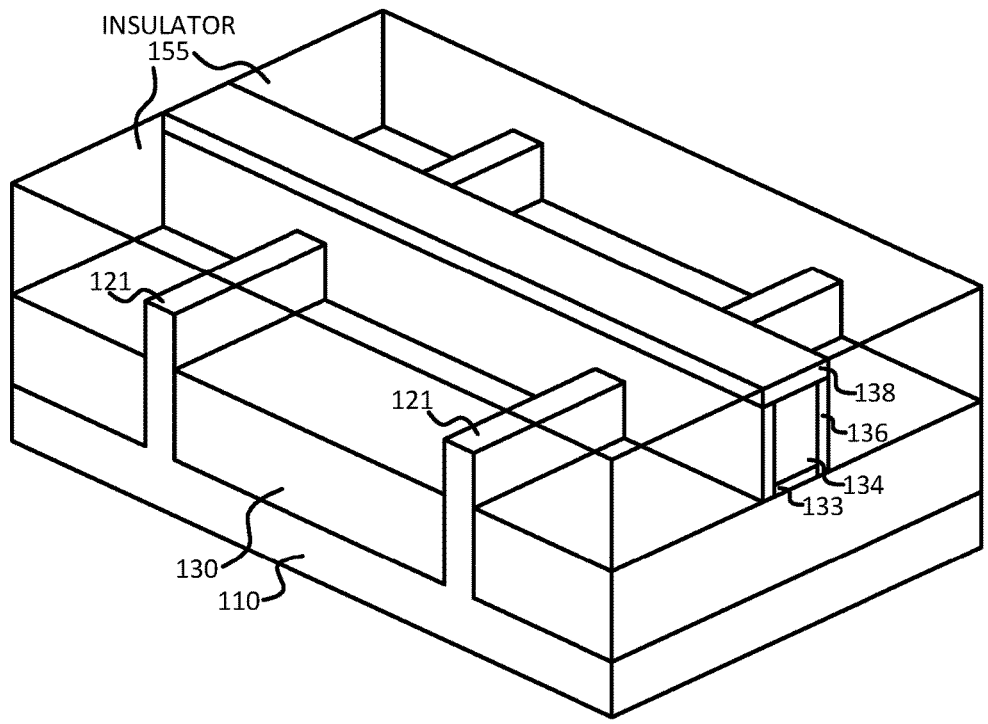

FIG. 1E illustrates an example structure formed after a layer of insulator fill material 155 has been formed on the structure of FIG. 1D, in accordance with an embodiment. Note that the insulator material 155 is illustrated as transparent to allow for underlying features to be viewed. In some embodiments, the insulator material 155 may include a dielectric material, such as silicon dioxide, for example. In a more general sense, any number of suitable insulator materials can be used, as will be appreciated. In some embodiments, following deposition of the insulator material 155, a polish and/or planarization process may be performed to produce the example structure of FIG. 1E.

Figure 1F:
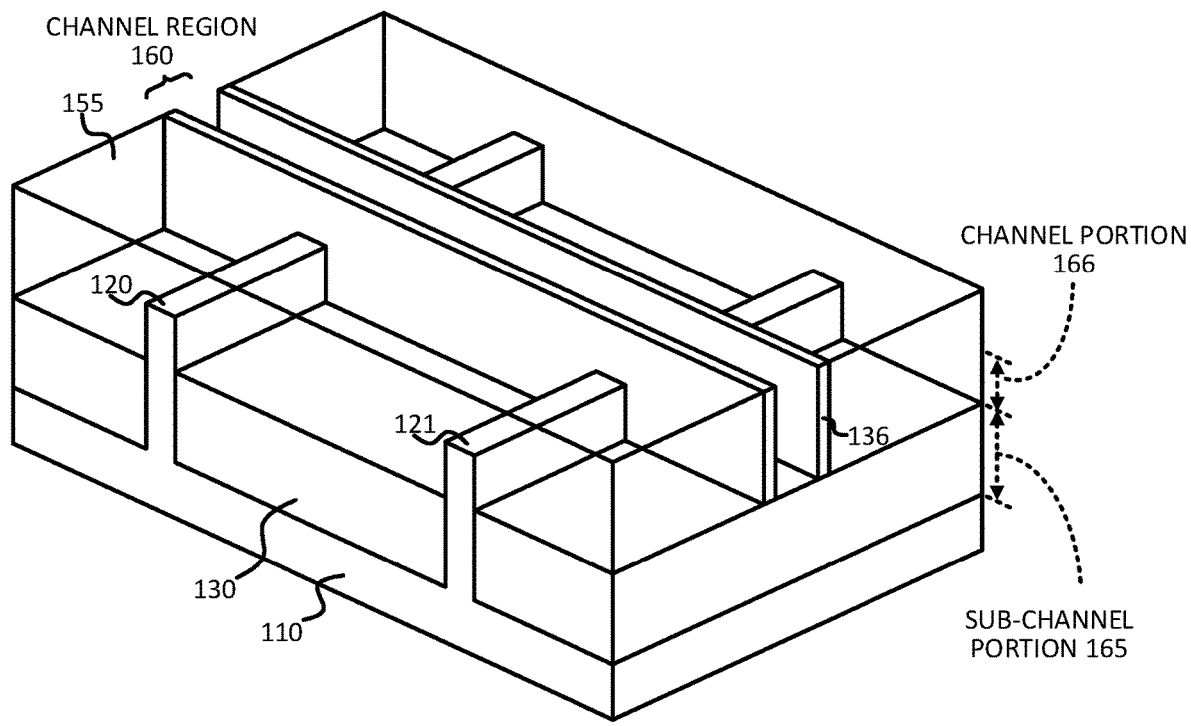

FIG. 1F illustrates an example structure formed after the dummy gate stack (including dummy gate dielectric 133 and dummy gate electrode 134) of FIG. 1D have been removed to re-expose the channel region 160, in accordance with an embodiment. In some embodiments, removing the dummy gate stack may include first removing hardmask layer 138 and then removing the dummy gate stack (layers 134 and 133, in this example case) using any suitable technique, such as selective wet and/or dry etches, and any necessary masking to the extent that the desired etch selectivity cannot be achieved, for example. Once the dummy gate materials are removed, the exposed channel region can be manipulated as desired, or simply left as is if no further channel processing is desired. For instance, in some cases, the channel can be further processed to form one or more nanowires or nanoribbons, by removing sacrificial fin materials, as described in U.S. Pat. No. 9,343,559.

Also shown in FIG. 1F is a dotted-line arrow to show the channel portion 166 of the fins and the sub-channel portion 165 of the fins. The channel portion 166 of the fin generally refers to the upper portion of fin that is above the STI layer 130 layer, which includes the channel region covered by the gate stack materials as well as the source and drain regions. The sub-channel portion 165 of the fin generally refers to the lower portion of the fin that is within the STI 130.

Figure 1G:
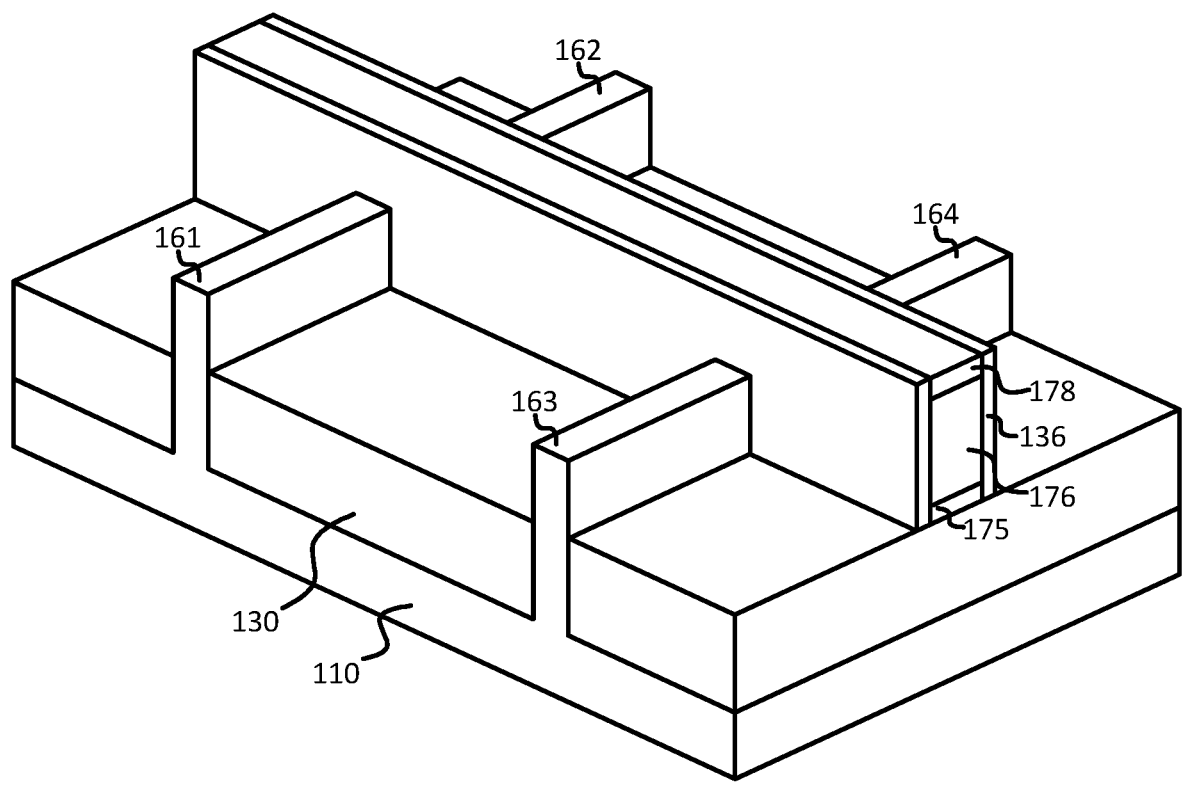

It will be appreciated that the order of FIGS. 1A-1F is only one example sequential process for forming the structure of FIG. 1F, and the process can be varied in accordance with the example embodiments disclosed herein. Additional front end processing can occur, for example forming a replacement gate structure. Once front end processing is complete, a structure such as the integrated circuit structure of FIG. 1G is achieved. It will be appreciated that FIG. 1G is only one example integrated circuit structure formed by a front end processing technique, and that any front end processing technique can be performed in accordance with the present disclosure.

FIG. 1G illustrates an integrated circuit including FinFET or gate-all-around transistor configurations, in accordance with some embodiments. As can be seen in the example structure of FIG. 1G, the channel region 160 of FIG. 1F has been processed according to an example embodiment. A gate dielectric structure 175 and gate electrode structure 176 is formed in the channel region 160. In addition, hardmask structure 178 has been formed on the gate electrode structure 176, in this example case, to protect the gate stack during other processing, such as during the source/drain processing that occurs post-gate-formation, to form source/drain regions 161/162 and 163/164. The gate dielectric structure 175 can be, for example, any suitable oxide such as silicon dioxide ($SiO_2$) or high-k gate dielectric materials or a combination of such materials to provide a multilayer gate dielectric structure. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric structure 175 to improve its quality when a high-k material is used. The gate electrode structure 176 material can be, for example, polysilicon, silicon nitride, silicon carbide, a metal layer (e.g., tungsten, titanium nitride, tantalum, and tantalum nitride), or a combination of such materials. The gate electrode structure 176 may include multiple components in some embodiments, such as work function metals and/or barrier materials surrounding a metal core or plug. The hardmask structure 178 may be formed using typical hard mask materials, such as such as silicon dioxide, silicon nitride, or a combination of materials to provide a multilayer mask for desired etch selectivity.

Note the source/drain regions 161/162 and 163/164 may be native to the original fin, or epitaxially provided after fin material in the source/drain areas is etched away or otherwise removed. In some cases, native fins may have an epitaxial layer formed thereon, to provide a desired degree of stress or strain on the channel (for better carried mobility in the channel). Further note that the shape of the source/drain regions may be wider and/or taller than the original fin geometry, depending on the source/drain forming processes used. In some embodiments, the source/drain processing may include patterning and filling the source/drain regions with appropriately doped epitaxial materials. In some embodiments, the source/drain epitaxial regions may be grown after performing an etch-under-cut (EUC) process. In some such embodiments, the source/drain regions 161/162 and 163/164 may extend under spacers 136 and/or under the gate dielectric 175, and such extended portions may be referred to as source/drain tips or extensions, for example. In some embodiments, the source/drain regions may be formed completely in the substrate, may include a portion of the substrate (e.g., including doping or otherwise altered), may be formed over the substrate, or any combination thereof or have any other suitable configuration. In some embodiments, source/drain regions 161/162 and 163/164 may include any suitable materials and, optionally, any suitable dopants, depending on the end use or target application. For example, in some embodiments, the source/drain regions 161/162 and 163/164 may include one or more group IV materials, such as Si, or Ge, or SiC, or SiGe, or a group III-V material, such as InGaAs, GaAs or GaN, to name a few example materials. Further, in some such embodiments, the source/drain region material may include n-type dopants and/or p-type dopants, depending on the end use or target application. For example, in the case of an n-MOS device formed on a column IV semiconductor fin or a column IV compound semiconductor. In some embodiments, the dopants will differ for other semiconductor materials. The source/drain regions may both be n-type doped with phosphorous, and in the case of a p-MOS device, the source/drain regions may both be p-type doped with boron. In another example case of a tunnel FET (TFET) device, the source and drain regions may be oppositely typed doped (e.g., one n-type doped and the other p-type doped). Further yet, in some embodiments, the source/drain regions 161/162 and 163/164 may include grading (e.g., increasing and/or decreasing) the content of one or more materials in at least one of the regions. Further still, in some embodiments, one or more of the layers included in the source/drain regions may be a multi-layer structure including at least two material layers, depending on the end use or target application. Example forming processes for the source/drain regions 161/162 and 163/164 can be found, for example, in U.S. Pat. Nos. 8,901,537, 9,117,791, 9,437,691, and 9,484,432. In a more general sense, any number of configurations for the source/drain regions can be implemented, and the present disclosure is not intended to be limited to any particular ones.

Once the source/drain regions are formed, a deposition of insulator material can be provided over the structure and planarized. A standard or custom source/drain contact formation process flow may proceed from there. In one example case, after forming the contact trenches in the insulator material and over the source/drain regions 161/162 and 163/164, a contact structure is provided therein, which in some example embodiments may include a resistance reducing metal and a contact plug metal, or just a contact plug. Example contact resistance reducing metals include silver, nickel, aluminum, titanium, gold, gold-germanium, nickel-platinum or nickel-aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, using conventional deposition processes. Other embodiments may further include additional layers, such as adhesion layers (e.g., titanium nitride) and/or liner or barrier layers (e.g., tantalum nitride), if so desired.

In the example structure of FIG. 1G, the left transistor may be a p-MOS device, in some embodiments, and source/drain regions 161/162 may both be doped with a p-type dopant (e.g., boron). In one such case, the right transistor may be an n-MOS device, and source/drain regions 163/164 may both be doped with an n-type dopant (e.g., phosphorus). Alternatively, the left and right transistors can have the same polarity. Further, in embodiments where one of the transistors is a p-MOS device and the other is an n-MOS device, they may both be included in a CMOS device, for example. Note that the transistors in such a CMOS device configuration may not share the same gate stack, for example.

As will be appreciated in light of the present disclosure, in some embodiments, a transistor (or other integrated circuit layers, structures, features, or devices) formed using the techniques described herein may be formed at least one of above and on the substrate, as various portions of the transistor (or other integrated circuit layers, structures, features, or devices) may be formed on the substrate (e.g., the source/drain regions 161/162 and 163/164), various portions may be formed above the substrate, and various portions may be considered to be both on and above the substrate, for example.

FIG. 2A illustrates an example perspective view of an integrated circuit structure after completion of a first type of front end processing to produce a plurality of non-planar transistor devices each having a source, drain and gate region, in accordance with an embodiment of the present disclosure. In FIG. 2A, the gate, source, and drain regions for adjacent transistor devices do not merge according to this first type of front end processing and remain electrically isolated from each other within the integrated circuit structure.

An integrated circuit structure 200 is shown in FIG. 2A, including a substrate 210 having a plurality of fins (not visible in FIG. 2A, but shown in cross-section in FIGS. 2B and 2C), after completion of front end processing, in accordance with an embodiment of the present disclosure. The fins can be formed on (or from) the substrate 210, as described for example with reference to FIGS. 1A-1G. The gate stacks 212, 214, 216, 218, and 219, the source or drain regions 220, 222, 224, 226, and 228, and the source or drain regions 230, 232, 234, 236, and 238 are shown, after completion of front end processing. Note that metal contacts to each of the source/drain regions and gate stacks, as well as surrounding insulator material to planarize the top of the structure, are not shown, to facilitate discussion). The source or drain regions 220, 222, 224, 226, and 228 can be either source or drain regions, and the regions 230, 232, 234, 236, and 238 can be the other of the source or drain regions, as will be appreciated. A front side gap fill material 240 in the area between the fins insulates the adjacent fins from each other and is deposited during the front end processing. Note the +X arrow which depicts the orientation of the integrated circuit structure as being upside right, rather than upside down.

It will be appreciated that the gate stacks (and also source or drain regions) can be a structure of one or more layers of material, or can be a single layer of material, in accordance with one or more embodiments of the present disclosure. The source/drain regions may include one or more epitaxial depositions of crystalline semiconductor material to provide a desired degree of stress on the channel (to improve channel mobility of carriers). The epitaxial material(s) may be on or part of the original fin, or a replacement fin, as previously explained.

FIG. 2B illustrates an example cross-sectional view as taken through a source region or a drain region of the integrated circuit structure of FIG. 2A, in accordance with an embodiment of the present disclosure. As shown, the fins 241, 242, 243, 244, and 245 are shown in the cross-sectional view through the source or drain region of the integrated circuit structure 200. Each of the source or drain regions 220, 222, 224, 226, and 228 are over and in contact with the fins 241, 242, 243, 244, and 245, respectively, in the source or drain region of the integrated circuit structure. FIG. 2C illustrates an example cross-sectional view as taken through a gate region of the integrated circuit structure of FIG. 2A, in accordance with an embodiment of the present disclosure. As shown in FIG. 2C, the gate stacks 212, 214, 216, 218, and 219 are over and in contact with the fins 241, 242, 243, 244, and 245 in the channel region of the integrated circuit structure 200.

Figure 3A:
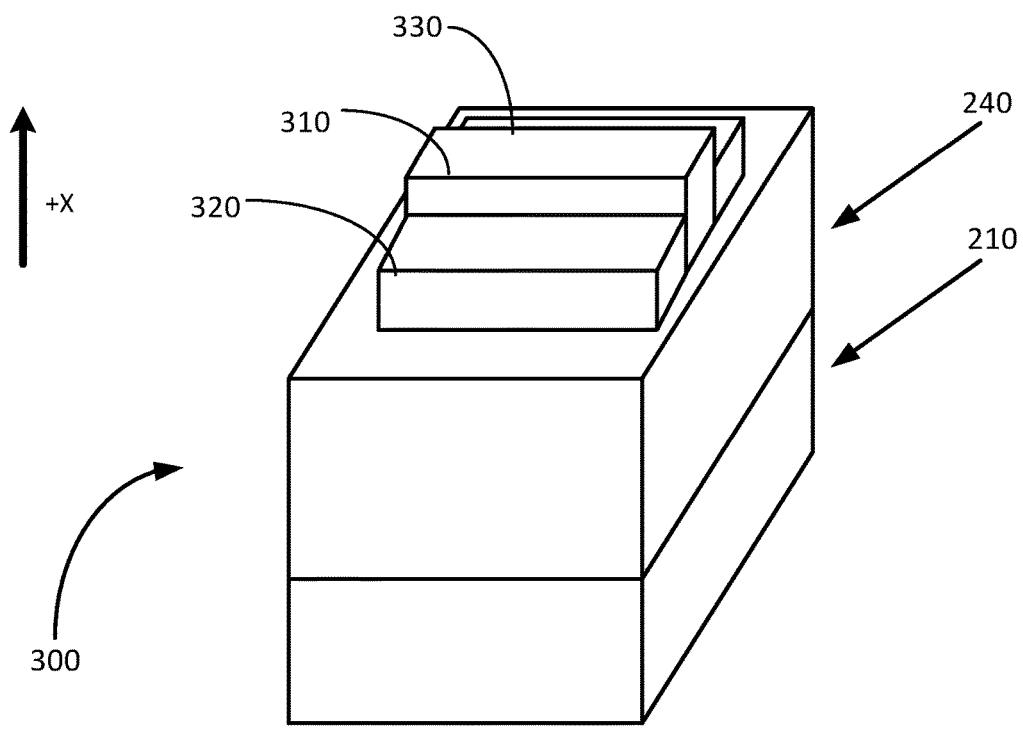
FIG. 3A illustrates an example perspective view of an integrated circuit structure after completion of a second type of front end processing to produce a plurality of non-planar transistor devices each having a source region, a drain region, and a gate region, in accordance with an embodiment of the present disclosure.

FIG. 3A illustrates an example perspective view of an integrated circuit structure after completion of a second type of front end processing to produce a plurality of non-planar transistor devices, in accordance with an embodiment of the present disclosure. As shown, as the semiconductor fins become closer together, the materials in the source and drain regions and the gate metals for adjacent transistor devices can begin to merge during the respective deposition processes. It will be appreciated in light of the present disclosure that FIGS. 4-10 are shown and described with the gate, source and drain regions being merged together for adjacent transistor devices, however the back side processing techniques of the present disclosure are likewise applicable to embodiments shown in FIG. 2A, for example, where the gate and source or drain regions have not merged and remain electrically isolated. In such embodiments, the electrical isolation can be enhanced by the techniques of the present disclosure, which are applicable to both integrated circuit structures as shown in FIG. 2A and as shown in FIG. 3A.

Although source and drain regions (220, 222, 224, 226, 228, 230, 232, 234, 236, and 238) and the gate regions (212, 214, 216, 218, and 219) are shown as having a substantially rectangular shape, other shapes can be formed, depending on factors such as deposition processes used as well as the crystalline materials being deposited and the materials onto which the deposition is being made, as will be appreciated in light of the present disclosure. The epitaxial deposition in the source/drain regions can, for example, have a faceted or diamond shape. In still other embodiments, the native fins may have a relatively conformal stressor material epitaxially deposited thereon, so as to maintain the original fin shape or provide a fin portion that is slightly fatter and taller due to the conformal deposition. Numerous epitaxial source/drain structures and gate stacks will be apparent, and the present disclosure is not intended to be limited to any particular ones.

In any case, the materials in the gate and source or drain regions merge when the fins are spaced too closely or when too much of a volume of epitaxial or gate materials are deposed either upon the totality of the wafer surface or in a localized region or as the result of an excursion from the intended process result, thereby causing the adjacent transistor devices to merge or causing capacitive coupling between adjacent devices, for example. This unfortunately can cause several problems in the operation of the integrated circuit structure, and in some instances may render the integrated circuit structure inoperable. It is thus advantageous to reduce any potential problems in the structure or operation of the IC structure by electrically isolating the neighboring gate, source, and drain regions. The techniques of the present disclosure allow devices to be fabricated in close proximity to each other and allow them to merge, for example during the front end processing, with the knowledge that later in the process, such undesired merging can still be mitigated during a back side processing. Note the +X arrow which depicts the orientation of the integrated circuit structure as being upside right, rather than upside down.

As shown in FIG. 3A, an integrated circuit structure 300 includes a substrate 210 having a plurality of fins formed thereon (or therefrom), as will be appreciated in light of the present disclosure. According to the second type of front end processing (that is different from the first type of front end processing of FIG. 2A), merging has occurred in FIG. 3A. As shown, the gate regions, source regions, and drain regions have merged for adjacent transistor devices of the integrated circuit. In particular, the material 310 has merged the gate stacks for adjacent transistor devices, and the materials 320 and 330 has merged the corresponding source and drain regions for adjacent transistor devices.

Figure 3B:
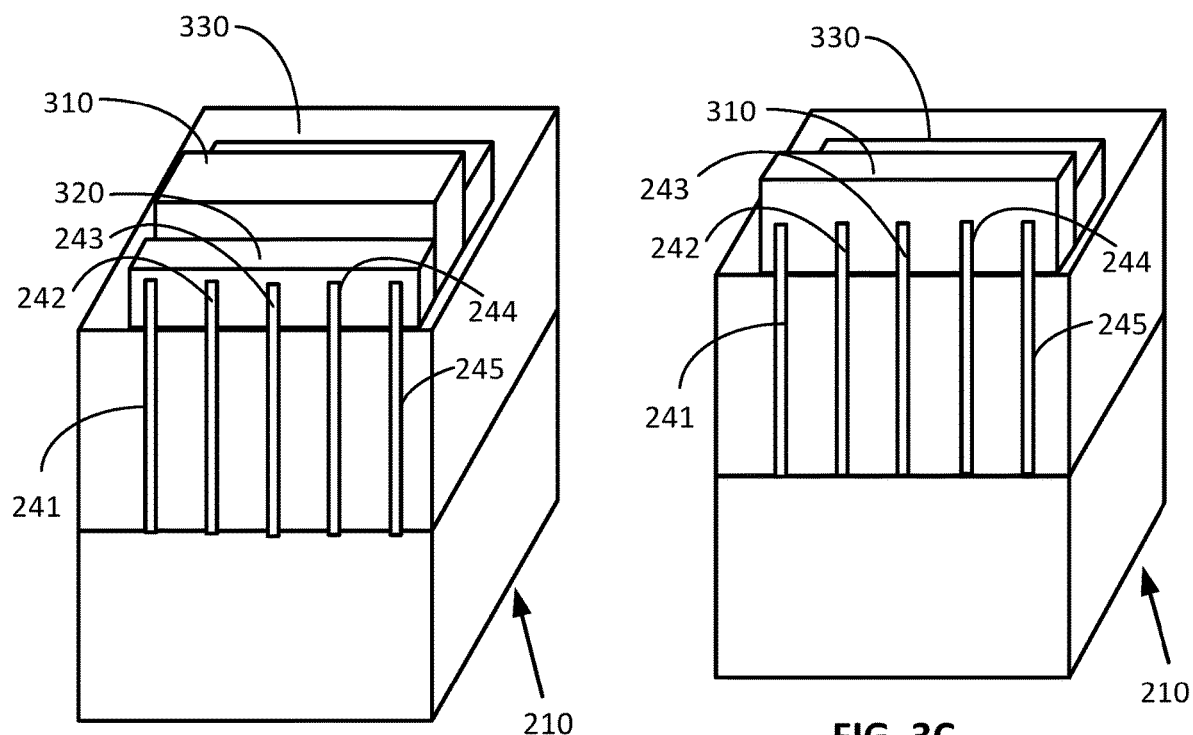
FIG. 3B illustrates an example cross-sectional view as taken through a source region or a drain region of the integrated circuit structure of FIG. 3A, in accordance with an embodiment of the present disclosure.
Figure 3C:
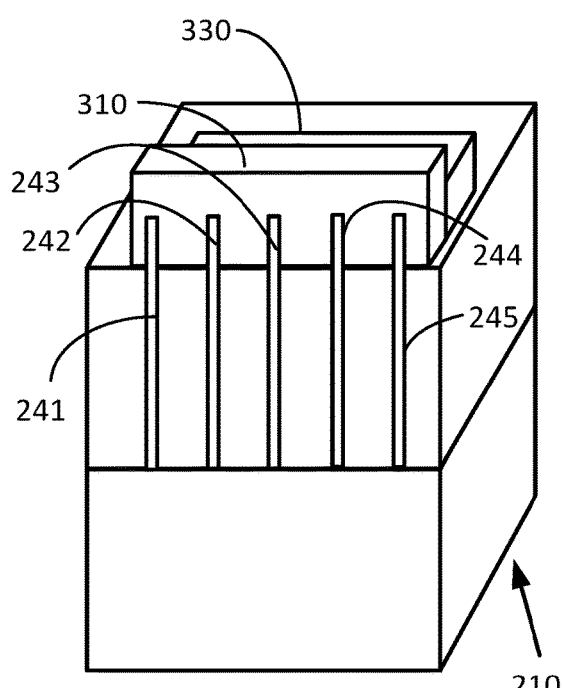
FIG. 3C illustrates an example cross-sectional view as taken through a gate region of the integrated circuit structure of FIG. 3A, in accordance with an embodiment of the present disclosure.

FIG. 3B illustrates an example cross-sectional view as taken through a source region or a drain region of the integrated circuit structure of FIG. 3A, in accordance with an embodiment of the present disclosure. The fins 241, 242, 243, 244, and 245 are shown in the cross-section through the source or drain region of the integrated circuit structure 300. The merging of the material(s) 320 between adjacent transistor devices in the source or drain regions is visible in FIG. 3B. FIG. 3C illustrates an example cross-sectional view as taken through a gate region of the integrated circuit structure of FIG. 3A, in accordance with an embodiment of the present disclosure. The fins 241, 242, 243, 244, and 245 are shown in the cross-section through the gate region 310 of the integrated circuit structure 300. The merging of the material(s) 310 between adjacent transistor devices in the gate regions is shown in FIG. 3C.

Methodology and Architecture—Back Side Processing

In accordance with the present disclosure, after completion of front end processing of the integrated circuit structure, such as after the final gate stack and the source/drain regions are formed, or after even after the metal contacts to each of the final gate stack and the source/drain regions are formed, the structure is rotated (flipped over 180-degrees) to access the back side of the integrated circuit structure. To facilitate this process, the front side of the integrated circuit structure can be bonded to a carrier wafer before the back side is accessed, according to some embodiments. In still other embodiment, a passivation layer is provided over the front side of the integrated circuit, to protect it during back side processing.

Figure 4:
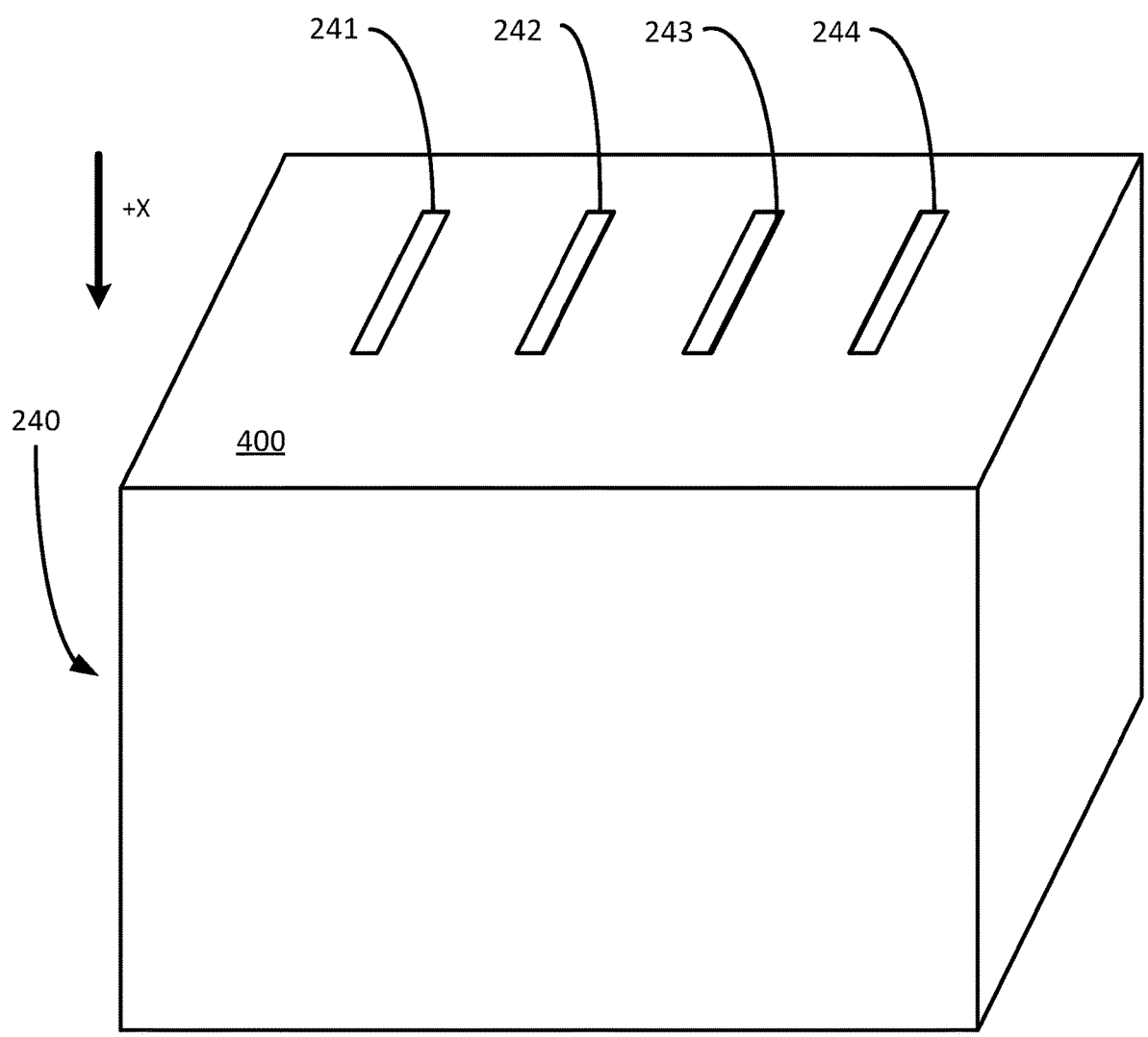
FIG. 4 illustrates an example perspective view of a back side of the integrated circuit structure after it has been flipped over 180-degrees and following a back side reveal processing of the integrated circuit structure where a back side of the fins is exposed, in accordance with an embodiment of the present disclosure.

Reference is made to FIG. 4 illustrating an example perspective view of a back side of the integrated circuit structure following a back side reveal processing of the integrated circuit structure where a back side of the fins is exposed, in accordance with an embodiment of the present disclosure. To arrive at the structure shown in FIG. 4, the integrated circuit structure (for example the structure 300 from FIG. 3A) is rotated (flipped over 180-degrees) to access the back side of the structure. The integrated circuit structure is then subjected to a back side reveal process through which the substrate (for example, substrate 210 of FIG. 2A or FIG. 3A) of the wafer is removed, for example, via a mechanical and/or chemical processing, to reveal the back surface 400 of the integrated circuit structure. Note the +X arrow is now in a downward direction, which depicts the orientation when the integrated circuit structure is flipped over. It will be appreciated in light of the present disclosure that the integrated circuit structure of FIG. 4 is upside down compared to the integrated circuit structure of FIGS. 2A and 3A.

The etch process which removes the substrate 210 is configured to stop on or near the interface between the front side trench bottom (stop on the bottom of the STI 240 material) and the substrate. After this process, the bottom of the fins 241, 242, 243, 244 are exposed. For illustrative and descriptive purposes, the carrier wafer to which the integrated circuit structure is bonded after front end processing, or the passivation layer provided on the front side of the integrated circuit, is not shown in FIG. 4. Front side metallization and other details are also not shown in this view for conciseness.

Figure 5:
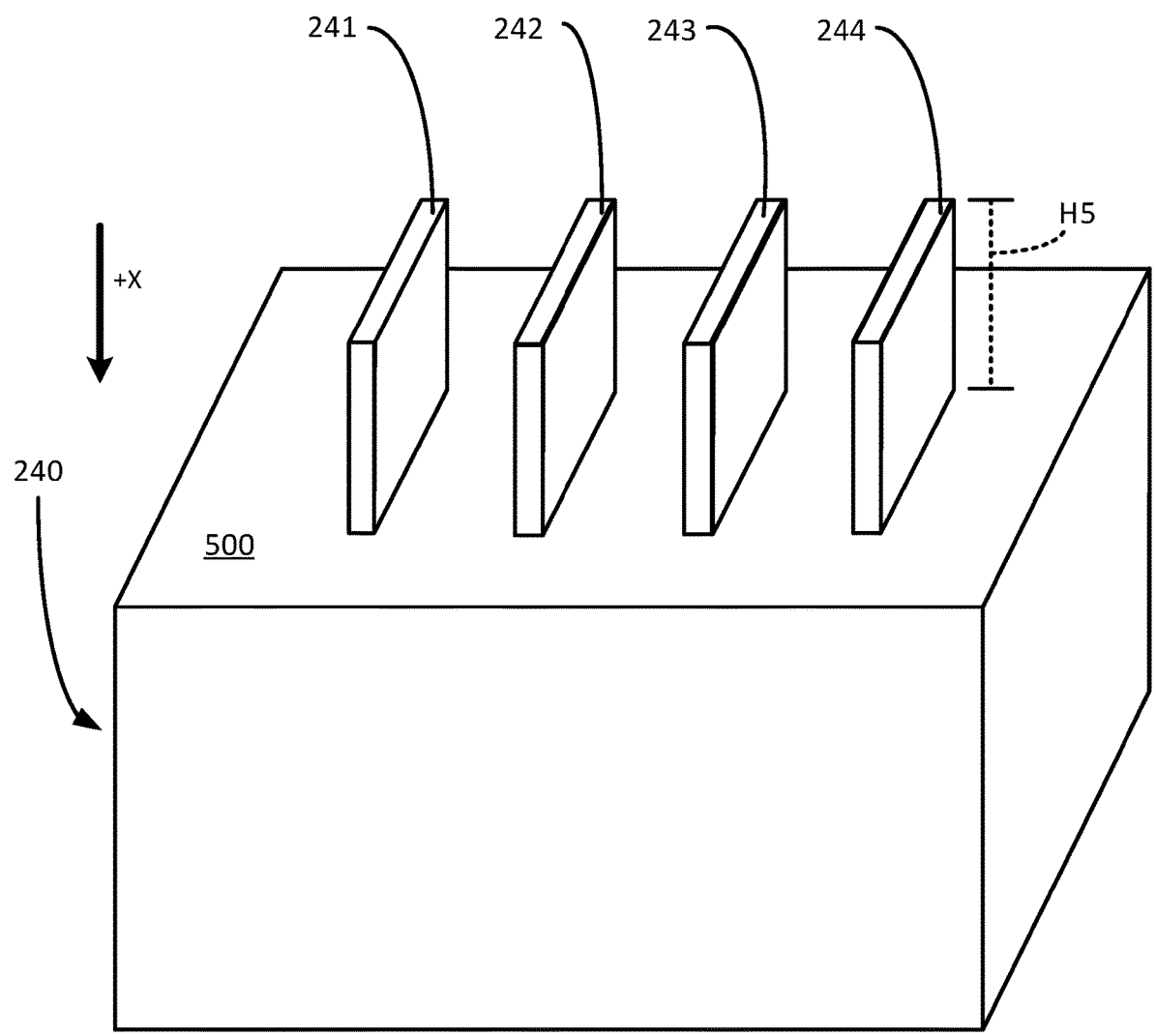
FIG. 5 illustrates an example perspective view of the back side of the integrated circuit structure after a first removal of a portion of shallow trench isolation (STI) material from the back side of the integrated circuit structure, revealing a portion the semiconductor fins in the sub-channel region, in accordance with an embodiment of the present disclosure.

FIG. 5 illustrates an example perspective view of the back side of the integrated circuit structure after a first removal of a portion of shallow trench isolation (STI) material from the back side of the integrated circuit structure, revealing a portion the semiconductor fins in the sub-channel region, in accordance with an embodiment of the present disclosure. Note the +X arrow still in a downward direction, which depicts the orientation when the integrated circuit structure is upside down. To arrive at the structure of FIG. 5, a first portion of the STI material 240 has been removed from the back side of the integrated circuit structure. The portion of the STI material 240 can be removed, for example, by an etch process which is selective to the fins 241, 242, 243, and 244 and etches the STI material 240 down a predetermined height or distance 'H5' to the surface 500 as shown. The fin material may be a group IV material such as silicon, silicon germanium (SiGe), Germanium, or a group III-V semiconductor material such as GaN, InGaAs or another semiconductor material. The STI material 240 may be any insulating material, such as a flowable or spin-on oxide or a deposited oxide or other suitable bulk insulator material (e.g., silicon dioxide, porous silicon dioxide, a polymer, or other insulator material that has a fast etch rate relative to the etch rate of the fins, for a given etch chemistry). FIG. 5 shows the state of the integrated circuit structure after completion of a first removal of a first portion of the trench gap-fill material 240 after being recessed down to the surface 500. The first portion of the trench gap-fill material 240 can be removed by any appropriate etching technique, depending upon the materials used or end use of the integrated circuit structure. For example, the etching can be a selective etch, a wet etch, a dry etch, or a combination or a wet and dry etch, as will be appreciated. If necessary, the fins can be masked (e.g., silicon nitride mask) to protect them during the etch process.

Figure 6:
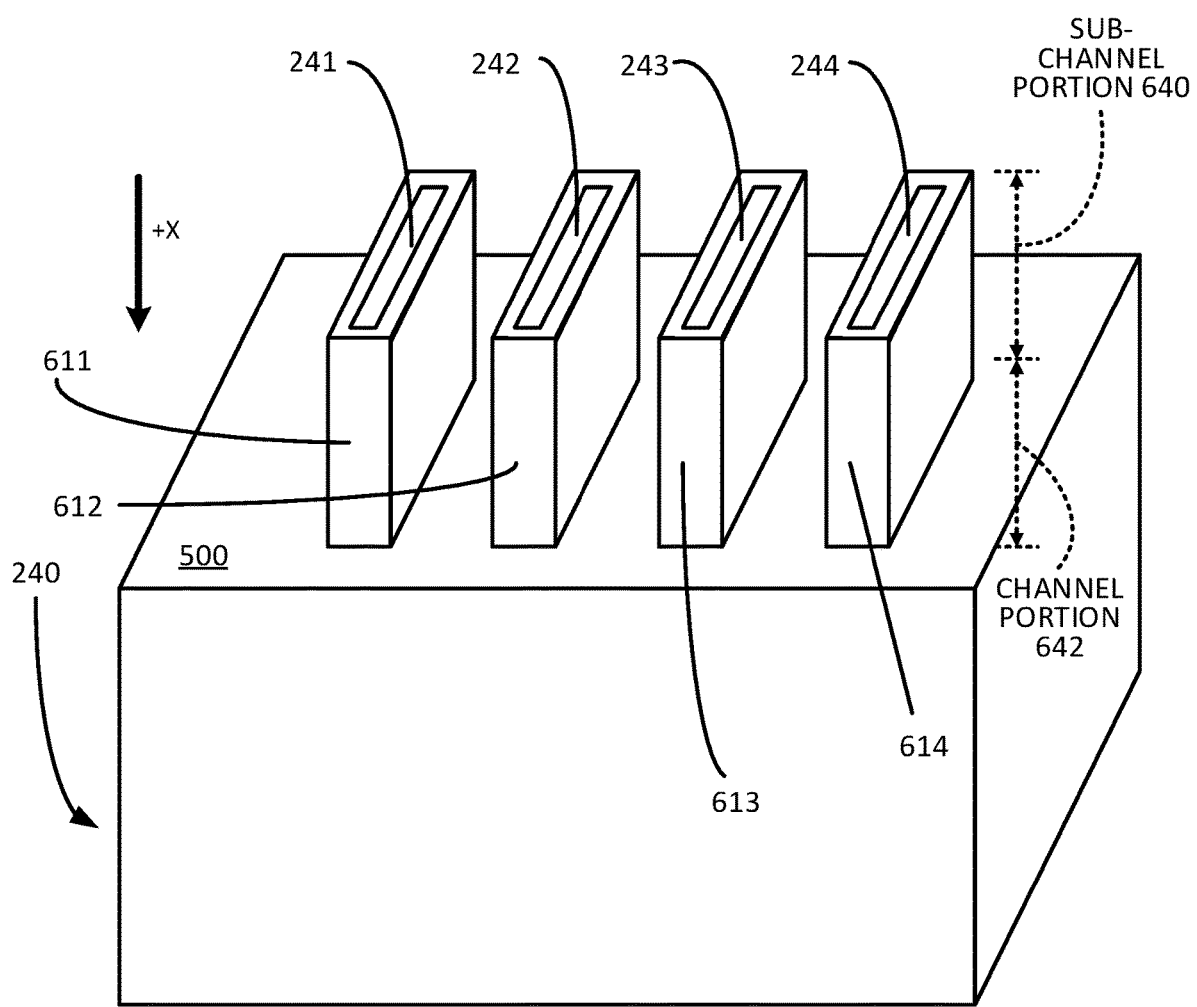
FIG. 6 illustrates an example perspective view of the back side of the integrated circuit structure after a spacer material has been formed around a full perimeter of the portion of the sub-fin that was revealed during the first removal of the STI material, in accordance with an embodiment of the present disclosure.

FIG. 6 illustrates an example perspective view of the back side of the integrated circuit structure after a spacer material has been formed about the portion of the sub-fin that was revealed during the removal of the first portion of the STI material, in accordance with an embodiment of the present disclosure. As shown in FIG. 6, in accordance with an example embodiment, a spacer material is deposited around a full perimeter of the exposed sub-channel portion for each of the semiconductor fins. So, for example, the deposition process includes forming a spacer 611 around the full perimeter of the sub-channel portion 640 of the fin 241, a spacer 612 around the full perimeter of the sub-channel portion of the fin 242, a spacer 613 around the full perimeter of the sub-channel portion of the fin 243, and a spacer 614 around the full perimeter of the sub-channel portion of the fin 244. It will be appreciated in light of this disclosure that the spacer may not always be around a full perimeter of the sub-channel portion. Rather, in some embodiments, the spacer is not around a full perimeter of the sub-channel portion and is instead only on the exposed opposing sidewalls of the sub-channel portion exposed during the etch. In such cases, note that the ends of the fin or other portions of the fin may not be exposed and therefore not covered by the spacer.

In accordance with an example embodiment, the spacers 611, 612, 613, and 614 can be deposited by an isotropic deposition of an etch resistant layer, such as a carbide material or a nitride material, followed by a dry etch of the same material, which forms the spacer structures 611, 612, 613, and 614. The composition of the spacers 611, 612, 613, and 614 depends upon the materials of the fins and other materials of the integrated circuit structure, as will be appreciated in light of the present disclosure. For example, for a fin 241, 242, 243, or 244 comprised of silicon, the spacers 611, 612, 613, or 614 can be comprised of silicon nitride. The spacers 611, 612, 613, and 614 define the region trimmed from the source or drain region and the gate region, as will be appreciated in light of the present disclosure. In some embodiments, a wider or narrower spacer can be used. Refer to FIGS. 9A-9H for example spacer structures according to various example embodiments. It is desirable that the spacers do not merge, as will be appreciated in light of the present disclosure. In particular, the spacers protect the sub-channel portion of the fin but allow the merged source/drain and gate materials to be removed, thereby allowing for electrical isolation of neighboring transistor devices. The spacer material is resistant to the etch chemistry used to remove these merged materials, or otherwise has a slower etch rate than the merged materials for the given etch chemistry (or chemistries, as the case may be).

Figure 7:
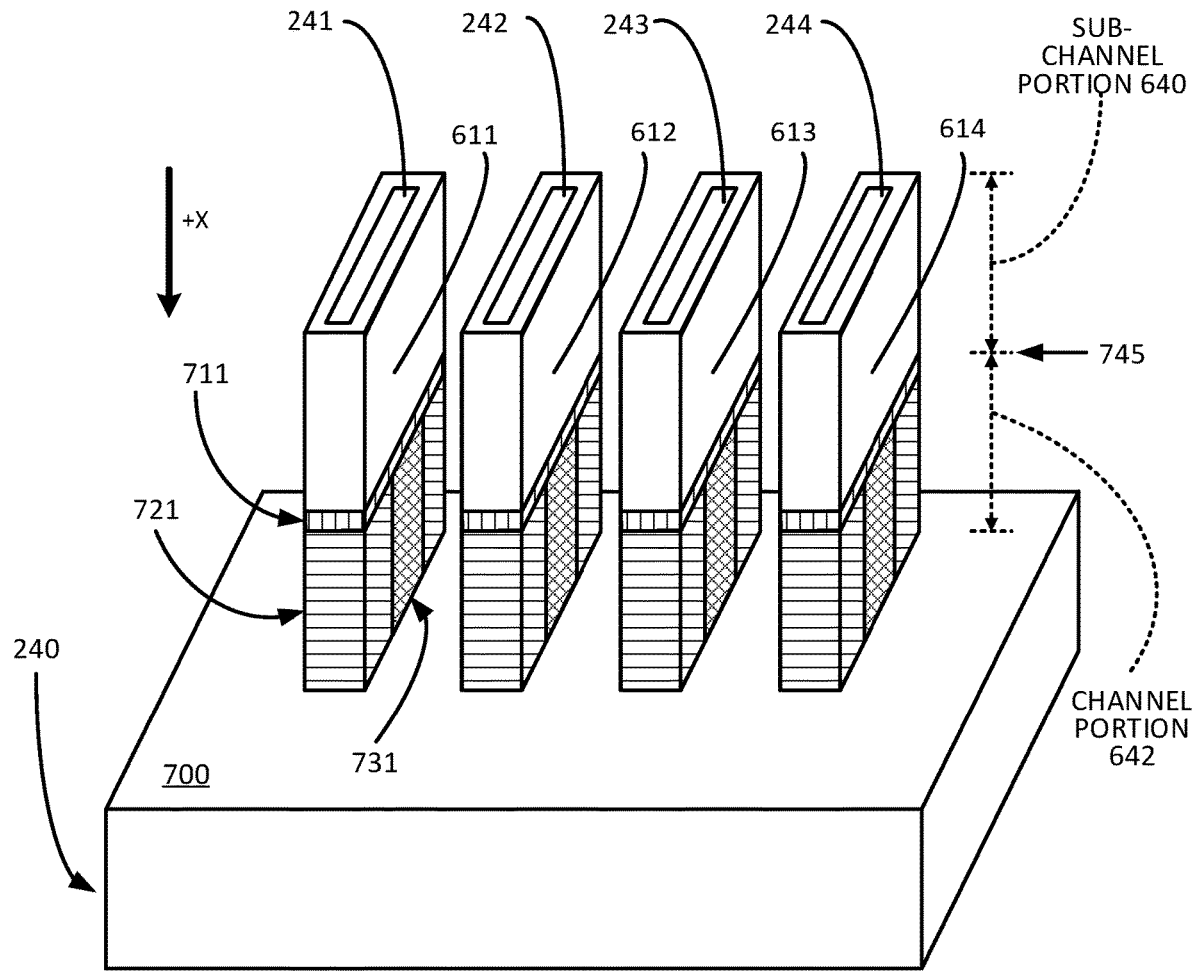
FIG. 7 illustrates an example perspective view of the back side of the integrated circuit structure after a second removal is performed on the back side of the integrated circuit device, to reveal the source region, the gate region, and the drain region of transistors of the integrated circuit device and form an airgap between adjacent transistor devices of the integrated circuit structure, in accordance with an embodiment of the present disclosure.

FIG. 7 illustrates an example perspective view of the back side of the integrated circuit structure after a second removal is performed on the back side of the integrated circuit device, to reveal the source, gate and drain regions of transistors of the integrated circuit device and thereby forming an airgap between adjacent transistor devices of the integrated circuit structure, in accordance with an embodiment of the present disclosure. Note the +X arrow still in a downward direction, which depicts the orientation when the integrated circuit structure is upside down.

The second removal further recesses the STI material 240 down to a surface 700, which thereby removes merged source/drain and gate materials and thus provides an airgap between the fins 241, 242, 243, and 244, in the source regions, the drain regions, and the gate regions. As shown, the fins 241, 242, 243, and 244 each have a sub-channel portion 640 and a channel portion 642. The integrated circuit structure includes spacers 611, 612, 613, and 614 that are around a full perimeter of the sub-channel portion 640 of the fins 241, 242, 243, and 244, respectively. In this embodiment, an STI material 711 is between the spacers (611, 612, 613, and 614) and the epitaxial source or drain regions 721 and between the spacers and the gate stack 731. Note that this STI material 711 can be, for example, the initial STI material 240 deposited during the front end processing. To this end, further note that the STI material 711 can be the same material as the STI material 240. The resulting structure shown in FIG. 7 illustrates the resulting geometry as being substantially vertical in nature (i.e., the sidewall regions of materials 611, 612, 613, 614, 731, 721, 711 are oriented vertically), however, in some embodiments these sidewall regions may not be vertical and coplanar with each other. For example, in some embodiments the surface may not be planar, as long as the separation is achieved between adjacent regions. In some embodiments, regions 721 and 731 and 711 may be recessed slightly beneath the spacer. In some embodiments, regions 731 may extend beyond the confines of the vertical projection of the spacer material 611. Other variations in structures will be appreciated.

As shown in FIG. 7, the gate stack 721 in the area of the channel portion 642 and possibly STI material 711 that is not protected by the spacers have been removed via the further back side processing. As can be further seen, in the region where the gate metal of gate stack 721 has been vacated, an airgap now exists. The etch process to arrive at FIG. 7 can, for example, be a wet etch, a dry etch, a combination of both a wet etch and a dry etch, a vertical directed etch, or multiple dry etches.

Removing the metal of the gate stack 721 typically involves an aggressive etch chemistry, and thus by depositing a suitably etch resistant spacer about a full perimeter of the exposed (sub-channel) portion 640 of the sub-fin, the spacer protects the fin during the aggressive metal-etching etch chemistry. The spacers 611, 612, 613, and 614 protect the respective fins 241, 242, 243, and 244 from the second etch to remove the gate metal, in accordance with the present disclosure.

It will be appreciated in light of the present disclosure that in some embodiments, the STI material 240 (e.g., oxide) can be removed by the first etch to above the gate metal or the first etch can be designed to stop before the gate metal (for example to a height that is less than the height H5 shown in FIG. 5). According to such embodiments, the spacer material would have a shortened height as compared to H5 and only extend partially into the sub-channel portion. However, the spacer would still fully protect the fin in the remainder of the sub-channel portion and the channel portion. With reference to FIG. 7, it may be possible for the first etching of the STI 240 to not extend fully to the interface 745 between the sub-channel portion 640 and the channel portion 642, but to only extend partially within the sub-channel portion 640, and the spacer thus protects the fin in the sub-channel portion 640 as well as the channel portion 642.

In an embodiment, the portion of the sub-fins 241, 242, 243, 244 that are inside of the spacers 611, 612, 613, 614, respectively (i.e., the part of the fin banded by the spacer) could also be recessed during this second removal of gap fill material 240. The fins in the sub-channel portion 640 could be recessed at the same time as the gate metal and the STI material are recessed, or at a time before or after the second recessing of the gap fill material 240. Since the sub-channel portion 640 does not contribute to the electrical conduction of the transistor, the fin in the sub-channel portion is inconsequential and thus can be removed, which helps in preventing sub-channel leakage.

As shown in FIG. 7, an airgap exists where the gate metal and STI (trench-fill dielectric) material previously existed. In some instances, a fixed charge can be formed upon the etched surfaces following the etch process. It may therefore be useful in some embodiments to perform a low temperature anneal with a hydrogen or other ambient to passivate the surface. The anneal can be performed under elevated pressure and can be performed in an ambient of Hydrogen, forming gas, Deuterium or other gas.

In some embodiments, the techniques stop here by forming the airgap as an isolation structure to electrically isolate the adjacent transistor devices of neighboring fins. To provide mechanical stability, to allow for ease in packaging for example, the airgap may be filled with an insulator material, such as silicon dioxide, a polymer, silicon nitride, a low-k dielectric material (e.g., a porous silicon dioxide, carbon-doped silicon dioxide, fluorine-doped silicon dioxide, organic polymer), as shown in FIG. 8.

Figure 8:
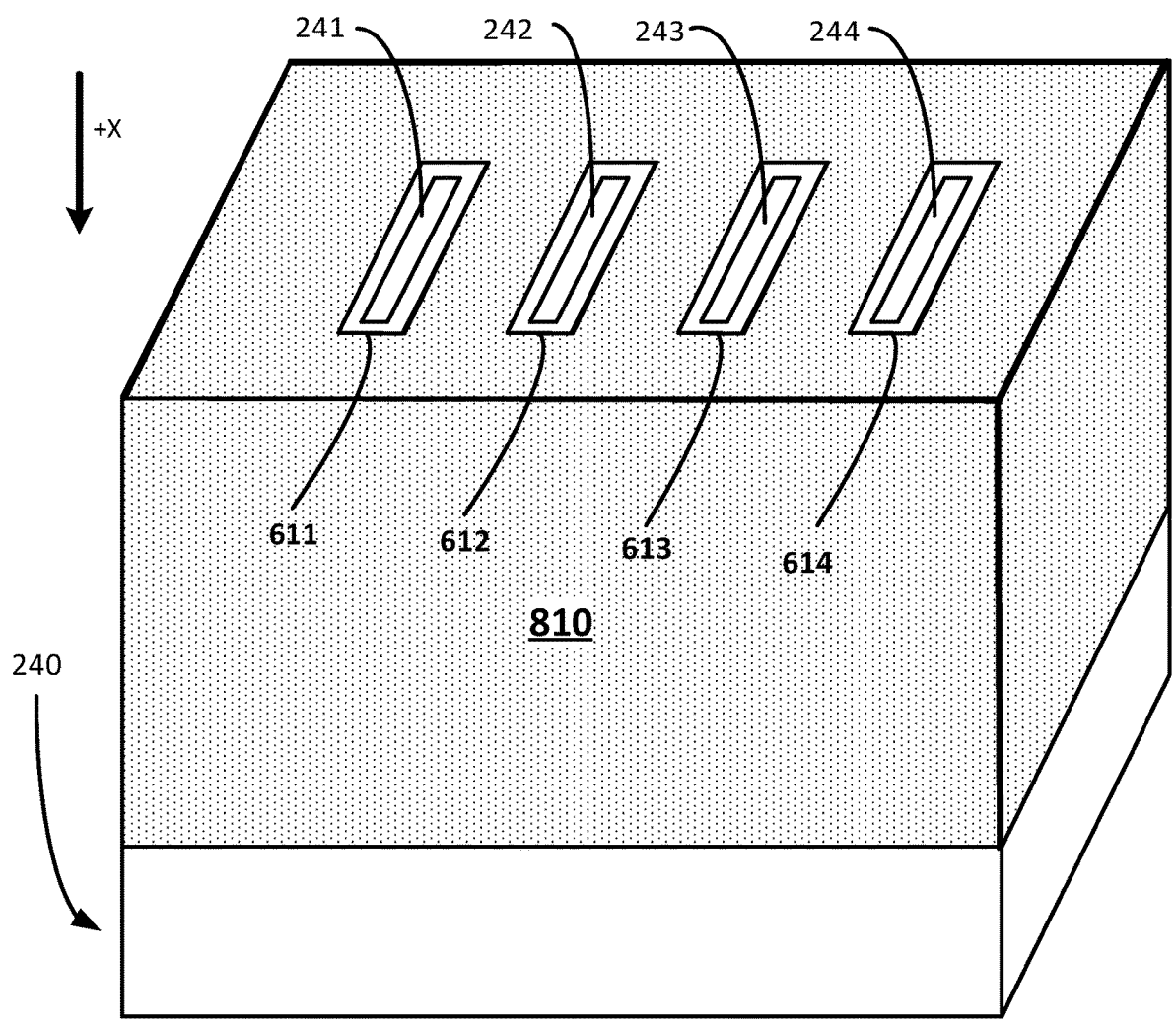
FIG. 8 illustrates an example perspective view of the back side of the integrated circuit structure after an insulating fill material has been deposited in the airgap between the individual transistor devices of the integrated circuit structure, in accordance with an embodiment of the present disclosure.

FIG. 8 illustrates an example perspective view of the back side of the integrated circuit structure after an insulating fill material has been deposited in the airgap between the individual transistor devices of the integrated circuit structure, in accordance with an embodiment of the present disclosure. The insulating material 810 fills the airgap region that previously existed, resulting in robust electrical isolation. It will be appreciated in light of the present disclosure that this can be an optional or additional processing, depending upon the integrated circuit structure and desired degree of insulation. The insulating material 810 can comprise a low-k material, such as a fluorinated oxide, or a porous insulating material, or remain as an air gap in some embodiments. Note the +X arrow still in a downward direction, which depicts the orientation of the integrated circuit structure as being upside down. The adjacent transistor devices now have an insulating structure between them, whether it be an air gap or physical insulator material.

Reference is now made to FIGS. 9A and 9B illustrating an example cross-sectional view taken through the gate region and the source or drain region, respectively, of the integrated circuit structure of FIG. 8, in accordance with an embodiment of the present disclosure. In FIG. 9A the cross-section is taken perpendicular to the fins and through the gate region, and in FIG. 9B the cross-section is taken perpendicular to the fins and through the source or drain region. If a low-k or other insulator material 810 was placed within the region vacated from the back side of the structure, as viewed in cross-section through the gate and source or drain regions, that insulator material would appear as shown in FIGS. 9A and 9B, respectively, in accordance with an embodiment of the present disclosure. Note that in FIGS. 9A and 9B, the integrated circuit structure has again been flipped over 180-degrees, and the +X arrow is now in an upward direction, which depicts the orientation of the integrated circuit structure as being upside right, rather than upside down.

Referring to FIG. 9A, each of the plurality of fins 241, 242, 243, and 244 are shown in cross-section through the gate regions of the integrated circuit structure. As shown in FIG. 9A, a spacer 611 surrounds a perimeter of the fin 241 in the sub-channel portion 640 of the fin 241, and a spacer 612 surrounds a perimeter of the fin 242 in the sub-channel portion 640 of the fin 242. Similar spacer structures are provided for each of fins 243 and 244. In addition, an insulation structure 810 is between each of the fins. Further note that the insulation structure 810 is adjacent to both the sub-channel portion 640 and the channel portion 642 of the fins. The insulation structure 810 is a different and distinct material from the first spacer 611 and the second spacer 612, as well as the other spacers. The first spacer 611 and the second spacer 612 are formed of a same material, such as silicon nitride or silicon carbide, according to an embodiment of the present disclosure. STI 711 can be part of the original STI material (STI 240), as will be appreciated, and is also distinct from insulation structure 810 and the spacers. In some embodiments, STI 711 is a regular-k dielectric material (e.g., silicon dioxide), the insulation structure 810 is a low-k dielectric (e.g., porous silicon dioxide), and the spacers are silicon nitride. Note that the insulation structure 810 can be in contact with both the spacers 611,612 and the STI 711. As can be further seen, each of the fins includes a gate stack 731 in the channel region 642 of the fin. As previously explained, a gate stack includes a gate dielectric structure on the channel region 642 of the fin, and a gate electrode structure thereon the gate dielectric structure. Each of the fins has a corresponding gate contact on the gate electrode of the gate stack. For example, the fin 241 has a corresponding gate contact 911, the fin 242 has a corresponding gate contact 912, the fin 243 has a corresponding gate contact 913, and the fin 244 has a corresponding gate contact 914. An STI material 240 can be provided on a top surface of the integrated circuit structure, and planarized to facilitate subsequent processing or packaging. It will be appreciated that other metal layers or layers of additional material may be provided between the electrodes and the STI material 240.

Referring to FIG. 9B, each of the plurality of fins 241, 242, 243, and 244 are shown in cross-section through the source or drain regions of the integrated circuit structure. As shown in FIG. 9B, a spacer 611 surrounds a perimeter of the fin 241 in the sub-channel portion 640 of the fin 241. Similar spacer structures are provided around fins 242, 243, and 244. As can be further seen, an insulation structure 810 is between each of the fins in both the sub-channel portion 640 and the channel portion 642. The insulation structure 810 is a different and distinct material from the spacer 611 materials, as will be appreciated in light of the present disclosure. The spacers can all be the same material, but they don't have to be, so long as they provide the desired etch resistance, as will be appreciated in light of this disclosure. STI 711 can be part of the original STI material (STI 240), as will be appreciated. As can be further seen, each of the fins includes an epitaxial source or drain region 721 in the source/drain regions of the fin. As previously explained, the epitaxial deposition in region 721 can have any number of source/drain structures, including multiple material layers, a desired dopant polarity and concentration, and optional grading/buffering. Each of the fins has a corresponding source or drain contact on the corresponding epitaxial source or drain region. For example, the fin 241 has a corresponding source or drain contact structure 921, the fin 242 has a corresponding source or drain contact structure 922, the fin 243 has a corresponding source or drain contact structure 923, and the fin 244 has a corresponding source or drain contact structure 924. An STI material 240 can be provided on a top surface of the integrated circuit structure, as previously explained. It will be appreciated that other metal layers or layers of additional material may be provided between the electrodes and the trench gap-fill material 240.

In some embodiments, the insulator fill 810 can be a multi-step fill which can, for example, include a lower-k dielectric material in the uppermost region (channel region 642) and a more mechanically rigid layer in the sub-channel region 640 of the integrated circuit structure. For instance, in one such embodiment, the insulator fill 810 in the channel region 642 is porous silicon dioxide, and the insulator fill 810 in the sub-channel region 640 is silicon dioxide. Numerous such insulator schemes will be apparent in light of this disclosure.

According to an embodiment of the present disclosure, the adjacent transistor devices are electrically isolated from each other in both the gate region (as shown in FIG. 9A) and also the source or drain region (as shown in FIG. 9B). In an embodiment, the integrated circuit structure can include multiple layers (not shown) of metal above the gate and source or drain contact region (device layer) or other front side processing. Refer to FIGS. 9C-9H for various example cross-sectional views of the integrated circuit structure configured in accordance with the teachings of the present disclosure.

The advantages of the back side processing of the present disclosure are evident when viewing, for example, an integrated circuit structure where the back side processing of the present disclosure has not occurred. FIGS. 10A and 10B illustrate example cross-sectional views taken through the gate region and the source or drain regions, respectively, of integrated circuit structures where back side processing has not occurred. FIG. 10A illustrates an example cross-sectional view of a transistor device where the gate region has merged with the neighboring gate regions of adjacent transistor devices, in a comparative case where back side processing has not been performed. The cross-sectional view is taken perpendicular to the fin and through the gate region. FIG. 10B illustrates an example cross-sectional view of the transistor device where the source and/or drain regions have respectively merged together with the neighboring source and/or drain regions of adjacent transistor devices, in a comparative case where back side processing has not been performed. The cross-sectional view is taken perpendicular to the fin and through the source or drain region. As shown, the gate and source or drain regions have merged together. Without the back side processing according to the techniques of the present disclosure, the adjacent transistor devices are not electrically isolated from each other and another process will need to be performed to electrically isolate the adjacent transistor devices from each other. More specifically, the metal material of the gate structures for the fins 1011, 1012, 1013, and 1014 has merged together for the adjacent fins to form one large structure 1030, and the semiconductor material for the source or drain regions for the fins 1011, 1012, 1013, and 1014 has merged together for adjacent fins to form one large structure 1035. As shown in FIG. 10A, although each of the fins 1011, 1012, 1013, and 1014 have a separate gate contact 1021, 1022, 1023, and 1024, respectively, the gate stacks 1030 have merged for each of the transistor devices such that they are not electrically isolated from each other. As further shown in FIG. 10A, the fins are separated in the sub-channel portion 740 via STI material. As further shown in FIG. 10B, each of the fins 1011, 1012, 1013, and 1014 has a separate source or drain contact 1031, 1032, 1033, and 1034, respectively, however the source or drain regions 1035 for adjacent transistor devices have merged together. An STI material 1040 is provided on a top surface of the integrated circuit structure.

FIGS. 9C-9H each illustrate an example cross-sectional view of an integrated circuit structure configured with a transistor including a spacer material surrounding the sub-channel portion of the fin, in accordance with an embodiment of the present disclosure. The cross-sections are taken perpendicular to the fin and through the gate region.

FIG. 9C illustrates an example cross-sectional view of an integrated circuit structure according to a configuration where the fins, denoted as 241C and 242C, have a slightly tapered structure. The fins 241C and 242C are slightly tapered such that they are wider at the bottom and narrower at a top portion of the fin. This cross-section is taken perpendicular to the fin and through the gate region. The slight taper of the fins 241C and 242C results in a tapered spacer 611C, STI material 711C, and gate region 731C, in this example embodiment. As shown, the channel portion of each of the fins 241C and 242C is in electrical contact with gate contacts 911C and 912C respectively. An STI material 240C can be provided on a top surface of the integrated circuit structure.

FIG. 9D illustrates an example cross-sectional view of an integrated circuit structure according to a configuration where the fins, denoted as 241D and 242D, have a relatively sharp point at the top. This cross-section is taken perpendicular to the fin and through the gate region. The structure of the spacer 611D and the STI material 711D remain relatively straight, however the gate region 731D may have a slight taper as shown, due to the sharp point at the top of the fin 241D. As shown, the channel portion of each of the fins 241D and 242D is in electrical contact with gate contacts 911D and 912D respectively. An STI or other suitable fill material 240D can be provided on a top surface of the integrated circuit structure.

FIG. 9E illustrates an example cross-sectional view of an integrated circuit structure according to a configuration where the fins, denoted as 241E and 242E, have relatively straight sides and a curved top. This cross-section is taken perpendicular to the fin and through the gate region. In this embodiment, the fins 241E and 242E have a rounded top. The spacer 611E, STI material 711E, and gate region 731E remain relatively straight to conform to the shape of the fin 241E. As shown, the channel portion of each of the fins 241E and 242E is in electrical contact with gate contacts 911E and 912E respectively. An STI or other suitable fill material 240E can be provided on a top surface of the integrated circuit structure.

FIG. 9F illustrates an example cross-sectional view of an integrated circuit structure according to a configuration where the fins, denoted as 241F and 242F, have slightly tapered sides and a curved top. This cross-section is taken perpendicular to the fin and through the gate region. In this embodiment, the fins 241F and 242F have a tapered side and a rounded top. The spacer 611F, the STI material 711F, and the gate region 731F likewise have a tapered side profile. As shown, the channel portion of each of the fins 241F and 242F is in electrical contact with gate contacts 911F and 912F respectively. A STI or other suitable fill material 240F can be provided on a top surface of the integrated circuit structure.

FIG. 9G illustrates an example cross-sectional view of an integrated circuit structure according to a configuration where the fins, denoted as 241G and 242G, have a relatively straight structure with a trapezoidal top. This cross-section is taken perpendicular to the fin and through the gate region. The spacer 611G, STI material 711G, and gate region 731G have a relatively straight side profile. As shown, the channel portion of each of the fins 241G and 242G is in electrical contact with gate contacts 911G and 912G respectively. An STI or other suitable fill material 240G can be provided on a top surface of the integrated circuit structure.

FIG. 9H illustrates an example cross-sectional view of an integrated circuit structure according to a configuration where the fins, denoted as 241H and 242H, have relatively straight sides and includes a nanowire 951. This cross-section is taken perpendicular to the fin and through the gate region. As shown, the channel portion of each of the fins 241H and 242H is in electrical contact with gate contacts 911H and 912H respectively. An STI or other suitable fill material 240H can be provided on a top surface of the integrated circuit structure. It will be appreciated in light of the present disclosure that other configurations and structures of fins, spacers, gate material and source or drain material can be provided.

Methodology—Back Side Processing

Figure 11:
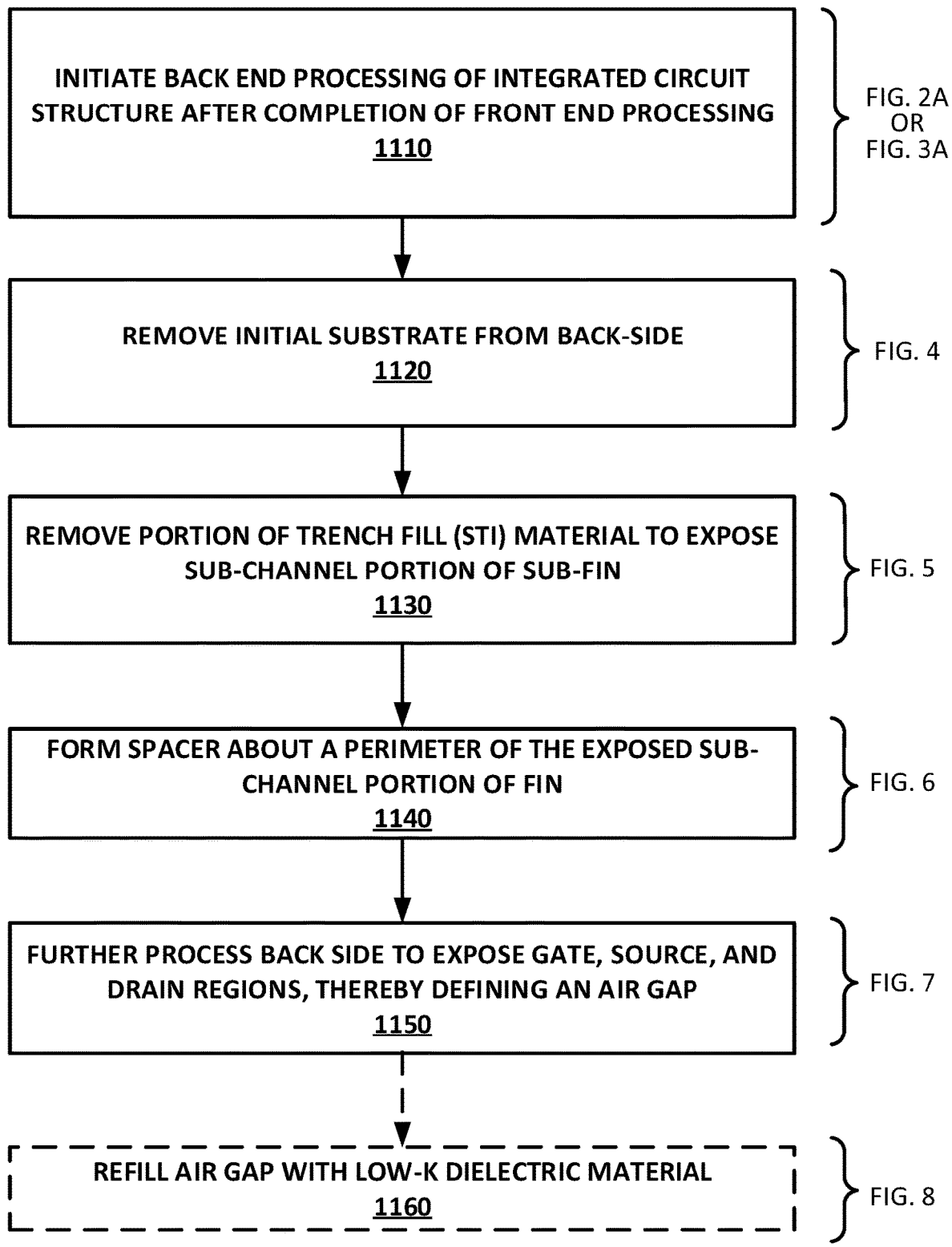
FIG. 11 illustrates a methodology for forming an integrated circuit that includes back side processing to electrically isolate adjacent transistor devices in an integrated circuit structure, according to an embodiment of the present disclosure.

FIG. 11 illustrates a methodology for forming an integrated circuit that includes back side processing, according to an embodiment of the present disclosure. According to an embodiment, at 1110, back side processing of an integrated circuit structure is initiated after completion of front end processing. Refer, for example, to FIG. 2A or FIG. 3A showing an example structure after completion (or substantial completion) of front end processing. At 1120, the initial substrate is removed from the back side of the integrated circuit structure. Refer, for example, to FIG. 4 showing an integrated circuit structure after the initial substrate (for example substrate 210 in FIG. 2A or FIG. 3A) has been removed from the back side of the device. Removing the initial substrate reveals the back side of the integrated circuit, and also the back side of the semiconductor fins, so that they are accessible for further processing.

At 1130, a portion of the trench gap-fill (STI) material is removed during a first recessing to expose the sub-channel portion of the sub-fin. Refer, for example, to FIG. 5, showing an integrated circuit structure after the first removal of a portion of trench gap-fill material, with the sub-channel portion of the sub-fins now exposed. At 1140, a spacer is formed around a full perimeter of the exposed sub-channel portion of the sub-fin, or at least on the exposed opposing sidewalls of the exposed sub-channel portion of the sub-fin. Refer, for example, to FIG. 6 showing an integrated circuit structure having spacers formed about the exposed sub-channel portion of the sub-fins.

At 1150, a further recessing is performed on the back side of the integrated circuit structure to expose the gate, source and drain regions, thereby leaving an air gap, as will be appreciated in light of the present disclosure. Refer, for example to FIG. 7 for an example integrated circuit structure after a second recessing has been performed to remove a second portion of the gap fill (STI) material, and thereby define an air gap between the source regions of adjacent transistor devices, the drain regions of adjacent transistor devices, and the gate regions of adjacent transistor devices for an integrated circuit structure. At 1160, the air gap can, in some embodiments, be refilled with a low-k dielectric material, or other suitable insulator material. Refer, for example, to FIG. 8 showing an integrated circuit structure after a low-k dielectric material has been filled in the previous air gap. Examples of the low-k dielectric material include a fluorinated oxide or a porous insulating material.

Note that reference herein to structural features such as a top and a bottom may generally refer to top or bottom surfaces that undulate within a tolerance (e.g., such as a surface that has a distance between its highest and lowest points of 2 nm or less, but is not perfectly flat). To this end, such reference to top or bottom of a given structure is not intended to be limited to a true top or bottom that is some specific point along a top or bottom surface of the structure, but instead refers to an overall or macro top or bottom surface, as will be appreciated. In addition, a sidewall as used herein generally refers to a downward trending surface that is lower than or otherwise a suitable distance from a lowest point of a top surface. Similarly, a sidewall as used herein may also generally refer to an upward trending surface that is higher than or otherwise a suitable distance from a highest point of a bottom surface. So, for instance, if the top surface of a given structure is a point, then the sidewall of that structure is the downward trending surface extending downward from that point, or more specifically, the downward trending surface that is 1 nm or more lower than that point, for example. Likewise, if the top surface of a given structure is a flat but undulating surface, then the sidewall of that structure is the downward trending surface extending downward from that undulating surface, or more specifically, the downward trending surface that is 1 nm or more lower than the lowest point of that undulating surface, for example.

Further note that reference herein to structural features such as width and height may generally refer to dimensions that vary in value, depending on where they are measured on the given structure. For instance, if a top surface of a structure undulates between high and low points rather than being perfectly flat, the height of that structure may vary depending on where it is measure relative. Similarly, if a fin-like structure extending upward is tapered such that the width decreases from the base to the top of the fin. In any such cases, a width or height can be measured, for example, as an average value of multiple width or height measurements for a given surface, or a median value of multiple width or height measurements for a given surface, or some other statistically relevant representation of the height or width or other dimension of interest. In some cases, a width of a structure can be measured as an intermediate or midway point between the macro top and bottom surfaces of that structure. Likewise, a height of a structure can be measured as an intermediate or midway point between the sidewalls of that structure.

Any number of additional processes may be performed to complete the formation of one or more transistor devices, such as forming source/drain contacts and performing back-end-of line interconnections (e.g., metal layers M1 through M9), for example. A standard or custom source/drain contact formation process flow may be used. Some embodiments may include additional layers, such as resistance reducing layers, adhesion layers (e.g., titanium nitride), and/or liner or barrier layers (e.g., tantalum nitride), if so desired.

Numerous benefits will be apparent in light of this disclosure. For example, in some embodiments, the techniques reduce or completely eliminate merging of source, drain, and gate regions of adjacent transistor devices in an integrated circuit structure. Further, in some embodiments, by providing an insulation structure between adjacent transistor devices, capacitive coupling between adjacent devices can be reduced or eliminated. In some embodiments, the insulation structure can include a low-k dielectric material, which can be a multi-level fill. The insulation structure electrically isolates the source, gate, and drain regions of adjacent transistor devices. In some embodiments, the adjacent transistor devices are electrically isolated from each other by forming an air gap therebetween during the back side processing, without filling the air gap. It will be appreciated in light of the present disclosure that the back side processing technique would be retro-fitted to other techniques not specifically disclosed herein, where the back side processing can be implemented to isolate adjacent transistor devices without requiring an isolation wall being formed during the front end processing. Further, the back side processing according to the present disclosure allows for a variety of materials to be used for the low-k dielectric material of the insulation structure. Given that many low-k materials are porous and not mechanically strong, if a wall of such a material was introduced during front end processing, it would be less likely to survive the harsh front end processing. However, when the low-k dielectric material is introduced after front end processing is complete, there is considerably less downstream thermal processing and less exposure to high process stresses, and the material constraints may be eased. In particular it will be appreciated in light of the present disclosure that an air gap can be implemented as the insulation-filled structure in the back side processing, which would not be possible in a front end processing technique. It will be appreciated in light of the present disclosure that the back side processing technique allows for fins to be placed more closely together, because the source, gate, and drain regions can be allowed to merge and then be separated later in the process via the self-aligned back side processing technique. Further, no additional lithography is required to achieve the integrated circuit structures according to some embodiments of the present disclosure.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging or tomography, local electrode atom probe (LEAP) techniques, 3D tomography, high resolution physical or chemical analysis, to name a few suitable example analytical tools. In particular, in some embodiments, such tools may indicate a structure or device configured with an insulation structure between the fins in the sub-channel and/or channel regions and such that adjacent transistor devices become electrically isolated from each other by the insulation structure formed during the back side processing. Further, some embodiments will further show a spacer structure around the sub-channel portion of one or more fins. Numerous detectable structural configurations and variations will be apparent in light of this disclosure.

Example System

Figure 12:
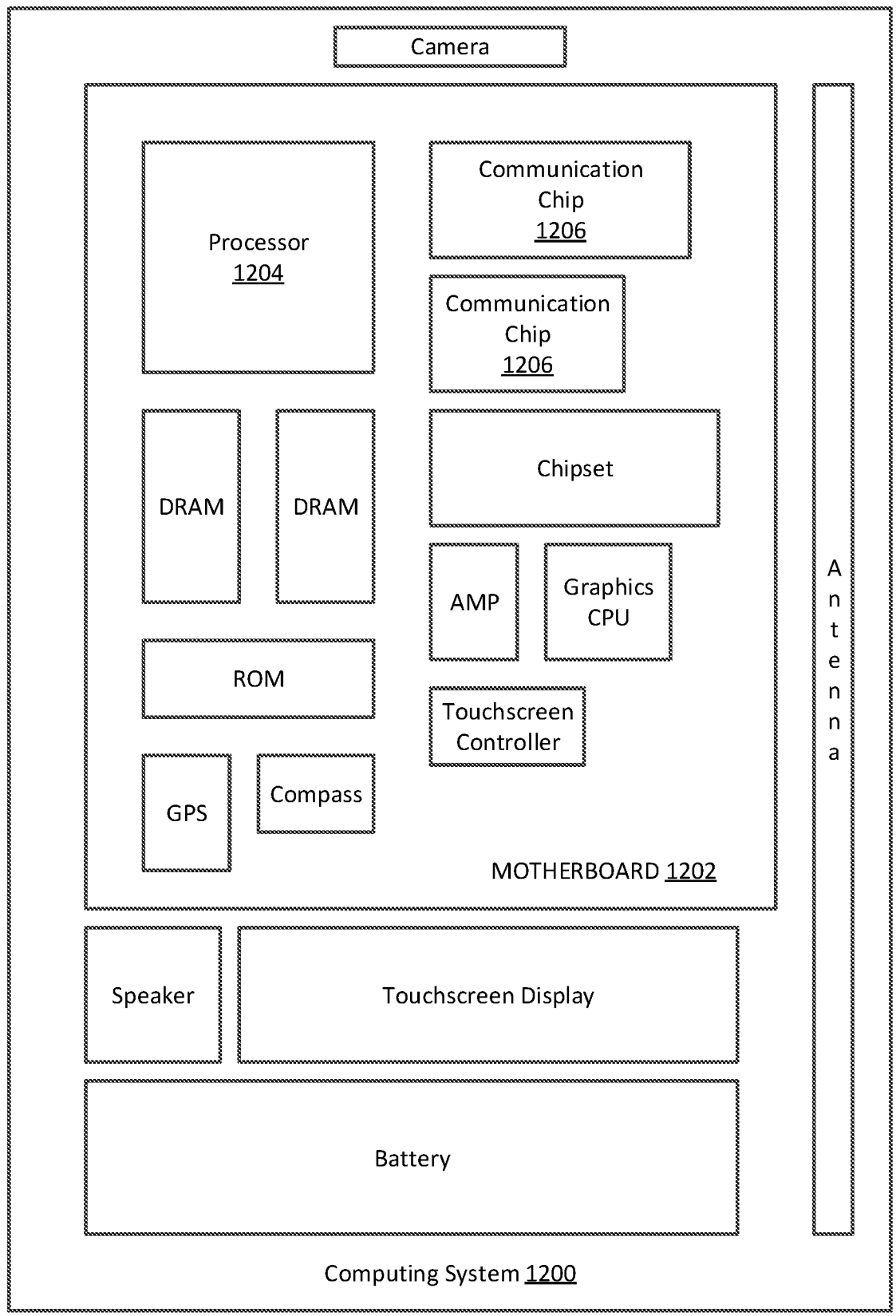
FIG. 12 illustrates a computing system implemented with integrated circuit structures or devices formed using the techniques disclosed herein, in accordance with some embodiments of this disclosure.

FIG. 12 illustrates a computing system 1200 implemented with one or more integrated circuit structures or devices formed using the techniques disclosed herein, in accordance with some embodiments of this disclosure. As can be seen, the computing system 1200 houses a motherboard 1202. The motherboard 1202 may include a number of components, including, but not limited to, a processor 1204 and at least one communication chip 1206, each of which can be physically and electrically coupled to the motherboard 1202, or otherwise integrated therein. As will be appreciated, the motherboard 1202 may be, for example, any printed circuit board, whether a main board, a daughterboard mounted on a main board, or the only board of system 1200, etc.

Depending on its applications, computing system 1200 may include one or more other components that may or may not be physically and electrically coupled to the motherboard 1202. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1200 may include one or more integrated circuit structures or devices configured with inter-fin isolation structures as variously provided herein, in accordance with an example embodiment. In some embodiments, multiple functions can be integrated into one or more chips (e.g., for instance, note that the communication chip 1206 can be part of or otherwise integrated into the processor 1204).

The communication chip 1206 enables wireless communications for the transfer of data to and from the computing system 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing system 1200 includes an integrated circuit die packaged within the processor 1204. In some embodiments, the integrated circuit die of the processor includes onboard circuitry that is implemented with one or more integrated circuit structures or devices configured with inter-fin isolation structures, as variously described herein. The term "processor" may refer to any device or portion of a device that processes, for instance, electronic data from registers and/or memory to transform that electronic data into other electronic data that may be stored in registers and/or memory.

The communication chip 1206 also may include an integrated circuit die packaged within the communication chip 1206. In accordance with some such example embodiments, the integrated circuit die of the communication chip includes one or more integrated circuit structures or devices configured with inter-fin isolation structures as variously described herein. As will be appreciated in light of this disclosure, note that multi-standard wireless capability may be integrated directly into the processor 1204 (e.g., where functionality of any chips 1206 is integrated into processor 1204, rather than having separate communication chips). Further note that processor 1204 may be a chip set having such wireless capability. In short, any number of processor 1204 and/or communication chips 1206 can be used. Likewise, any one chip or chip set can have multiple functions integrated therein.

In various implementations, the computing device 1200 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices configured with inter-fin isolation structures, as variously described herein.

Note that, as used herein, the expression "X includes at least one of A and B" refers to an X that may include, for example, just A only, just B only, or both A and B. To this end, an X that includes at least one of A and B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For instance, as used herein, the expression "X includes at least one of A, B, and C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, and C is not to be understood as an X that requires each of A, B, and C, unless expressly so stated. For instance, the expression "X includes A, B, and C" refers to an X that expressly includes each of A, B, and C.

Further Example Embodiments

The following examples pertain to further embodiments, from which numerous permutations and configurations will be apparent.

Example 1 includes an integrated circuit comprising: a first semiconductor fin having a channel portion and a sub-channel portion; a first spacer adjacent and in contact with opposing sidewalls of the sub-channel portion of the first semiconductor fin; a second semiconductor fin having a channel portion and a sub-channel portion; a second spacer adjacent and in contact with opposing sidewalls of the sub-channel portion of the second semiconductor fin; and an insulation structure between the first spacer and the second spacer, the insulation structure being distinct from the first and second spacers.

Example 2 includes the subject matter of Example 1, wherein the insulation structure comprises a low-k dielectric material.

Example 3 includes the subject matter of Example 1 or 2, wherein the insulation structure comprises an air gap between the first semiconductor fin and the second semiconductor fin.

Example 4 includes the subject matter of any of Examples 1-3, wherein the insulation structure comprises at least one of a fluorinated oxide and a porous insulating material.

Example 5 includes the subject matter of any of Examples 1-4, wherein the insulation structure comprises a first insulation material adjacent the first spacer and the second spacer, and a second insulation material adjacent the channel portion of the first semiconductor fin and the second semiconductor fin, wherein the second material has a lower-k dielectric value than the first material.

Example 6 includes the subject matter of any of Examples 1-5, wherein the first semiconductor fin and the second semiconductor fin comprise at least one of a group III-V semiconductor material and a group IV semiconductor material.

Example 7 includes the subject matter of any of Examples 1-6, wherein the first spacer and the second spacer comprise a carbide material.

Example 8 includes the subject matter of any of Examples 1-7, wherein the first spacer and the second spacer comprise a nitride material.

Example 9 includes the subject matter of any of Examples 1-8, wherein the first semiconductor fin is a silicon fin and the first spacer comprises silicon and nitrogen.

Example 10 includes the subject matter of any of Examples 1-9, and further includes a first gate structure over and in direct contact with the channel portion of the first semiconductor fin, the first gate structure including a gate dielectric layer and a gate electrode; a first source region adjacent to one side of the first gate structure, and a first drain region adjacent to an opposite side of the first gate structure; a second gate structure over and in direct contact with the channel portion of the second semiconductor fin, the second gate structure including a gate dielectric layer and a gate electrode; and a second source region adjacent to one side of the second gate structure, and a second drain region adjacent to an opposite side of the channel portion of the second gate structure.

Example 11 includes the subject matter of Example 10, and further includes a first source contact structure over and in direct contact with the first source region; a first drain contact structure over and in direct contact with the first drain region; a second source contact structure over and in direct contact with the second source region; and a second drain contact structure over and in direct contact with the second drain region.

Example 12 includes the subject matter of Example 10 or 11, and further includes a first gate contact structure over and in direct contact with the gate electrode of the first gate structure; and a second gate contact structure over and in direct contact with the gate electrode of the second gate structure.

Example 13 includes a method of fabricating an integrated circuit, the method comprising: removing at least a portion of a substrate from a back side of an integrated circuit structure, the integrated circuit structure comprising a number of non-planar transistor devices on a front side of the integrated circuit structure, at least some of the transistor devices including a source region, a drain region, and a gate structure, the integrated circuit structure including a plurality of semiconducting fins extending from substrate, the fins being at least part of the transistor devices on the front side of the integrated circuit structure and including a first semiconductor fin and a second semiconductor fin, wherein the removing is carried out after formation of source and drain regions; recessing, from the back side of the integrated circuit structure, isolation material between the first and second semiconductor fins to expose a sub-channel portion of the first semiconductor fin and a sub-channel portion the second semiconductor fin; depositing a spacer material around the sub-channel portion of each of the first and second semiconductor fins; and further recessing, from the back side integrated circuit structure, isolation material to form an air gap between the source region of the first semiconductor fin and the source region of the second semiconductor fin, and between the drain region of the first semiconductor fin and the drain region of the second semiconductor fin.

Example 14 includes the subject matter of Example 13, and further includes depositing a low-k dielectric material in the air gap.

Example 15 includes the subject matter of Example 13 or 14, and further includes bonding a second substrate to a front side of the integrated circuit structure, prior to removing at least a portion of the substrate.

Example 16 includes the subject matter of any of Examples 13-15, and further includes passivating a surface of the spacer material by performing a low temperature anneal.

Example 17 includes the subject matter of any of Examples 13-16, and further includes isotropically depositing a layer of etch resistant material; and performing a dry etch using the etch resistant material; wherein the etch resistant material has a slower etch rate than at least one of the source region, the drain region, and the gate structure, with respect to a given etch chemistry.

Example 18 includes the subject matter of any of Examples 13-17, wherein recessing isolation material between the first and second semiconductor fins to expose a sub-channel portion of the first semiconductor fin and a sub-channel portion the second semiconductor fin comprises performing a first etching process, and further recessing isolation material to form an air gap between source/drain regions of the first semiconductor fin and source/drain regions of the second semiconductor fin comprises performing a second etching process.

Example 19 includes the subject matter of Example 18, wherein the first etching process is different from the second etching process.

Example 20 includes the subject matter of Example 18 or 19, wherein the first etching process comprises at least one of: a selective etch, a wet etch, and a dry etch.

Example 21 includes the subject matter of Example 19 or 20, wherein the second etching process comprises at least one of: a vertical directed etch, multiple dry etches, a single wet etch, a single dry etch, and a combination of both a wet etch and a dry etch.

Example 22 includes an integrated circuit comprising: a semiconductor fin having a channel portion and a sub-channel portion; a gate structure over and in direct contact with the channel portion, the gate structure including at least one gate dielectric material and at least one gate electrode material; a source region adjacent one side of the gate structure; a drain region adjacent an opposite side of the gate structure; a source contact structure over and in direct contact with the source region; a drain contact structure over and in direct contact with the drain region; a gate contact structure over and in direct contact with the gate structure; a spacer adjacent and in contact with opposing sidewalls of the sub-channel portion of the semiconductor fin; a regular-k dielectric material adjacent the semiconductor fin and between the spacer and the gate structure; and a low-k dielectric material in direct contact with the spacer and the regular-k dielectric and in further in direct contact with the source region, the drain region, and the gate structure; wherein each of the spacer, regular-k dielectric material, and low-k dielectric material are different from one another.

Example 23 includes the subject matter of Example 22 and further includes a second semiconductor fin having a channel portion and a sub-channel portion; a second spacer adjacent and in contact with opposing sidewalls of the sub-channel portion of the second semiconductor fin; and wherein the low-k dielectric material is between the spacer and the second spacer.

Example 24 includes the subject matter of Example 22 or 23, wherein the low-k dielectric material comprises air.

Example 25 includes the subject matter of any of Examples 22-24, wherein the low-k dielectric material comprises at least one of: a fluorinated oxide and a porous insulating material.

Example 26 includes the subject matter of any of Examples 22-25, wherein the semiconductor fin comprises at least one of: a group III-V semiconductor material and a group IV semiconductor material.

Example 27 includes the subject matter of any of Examples 22-26, wherein the spacer comprises a carbide material.

Example 28 includes the subject matter of any of Examples 22-27, wherein the spacer comprises a nitride material.

Example 29 includes the subject matter of any of Examples 22-28, wherein the semiconductor fin is a silicon fin and the spacer comprises silicon and nitrogen.

Example 30 includes the subject matter of any of Examples 22-29, wherein the source region and the drain region each comprise silicon germanium.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
    a first fin comprising semiconductor material and having an upper portion and a lower portion;
    a first spacer adjacent and in contact with opposing sidewalls of the lower portion of the first fin, the first spacer having an uppermost surface and a bottommost surface;
    a second fin comprising semiconductor material and having an upper portion and a lower portion;
    a second spacer adjacent and in contact with opposing sidewalls of the lower portion of the second fin, the second spacer having an uppermost surface and a bottommost surface; and
    an insulation structure between the first spacer and the second spacer, the insulation structure being distinct from the first and second spacers, the insulation structure having an uppermost surface above the uppermost surface of the first spacer and above the uppermost surface of the second spacer, and the insulation structure having a bottommost surface co-planar with the bottommost surface of the first spacer and co-planar with the bottommost surface of the second spacer.

2. The integrated circuit of claim 1, wherein the insulation structure comprises a low-k dielectric material.

3. The integrated circuit of claim 1, wherein the insulation structure comprises an air gap between the first semiconductor fin and the second semiconductor fin.

4. The integrated circuit of claim 1, wherein the insulation structure comprises a fluorinated oxide and/or a porous insulating material.

5. The integrated circuit of claim 1, wherein the insulation structure comprises a first insulation material adjacent the first spacer and the second spacer, and a second insulation material adjacent the upper portion of the first fin and the upper portion of the second fin, wherein the second insulation material has a lower-k dielectric value than the first insulation material.

6. The integrated circuit of claim 1, wherein the semiconductor material of the first fin and the semiconductor material of the second fin each comprise a group III-V semiconductor material and/or a group IV semiconductor material.

7. The integrated circuit of claim 1, wherein the first spacer and the second spacer comprise a carbide material.

8. The integrated circuit of claim 1, wherein the first spacer and the second spacer comprise a nitride material.

9. The integrated circuit of claim 1, further comprising:
    a first gate structure over and in direct contact with the upper portion of the first fin, the first gate structure including a gate dielectric layer and a gate electrode;
    a first source region adjacent to one side of the first gate structure, and a first drain region adjacent to an opposite side of the first gate structure;
    a second gate structure over and in direct contact with the upper portion of the second fin, the second gate structure including a gate dielectric layer and a gate electrode; and
    a second source region adjacent to one side of the second gate structure, and a second drain region adjacent to an opposite side of the second gate structure.

10. The integrated circuit of claim 9, further comprising:
    a first source contact structure over and in direct contact with the first source region;
    a first drain contact structure over and in direct contact with the first drain region;
    a second source contact structure over and in direct contact with the second source region; and
    a second drain contact structure over and in direct contact with the second drain region.

11. The integrated circuit of claim 9, further comprising:
    a first gate contact structure over and in direct contact with the gate electrode of the first gate structure; and
    a second gate contact structure over and in direct contact with the gate electrode of the second gate structure.

12. An integrated circuit comprising:
    a fin comprising semiconductor material and having a channel portion and a sub-channel portion;
    a gate structure over and in direct contact with the channel portion, the gate structure including at least one gate dielectric material and at least one gate electrode material;
    a source region adjacent one side of the gate structure;
    a drain region adjacent an opposite side of the gate structure;
    a source contact structure over and in direct contact with the source region;
    a drain contact structure over and in direct contact with the drain region;
    a gate contact structure over and in direct contact with the gate structure;
    a spacer adjacent and in contact with opposing sidewalls of the sub-channel portion of the fin, the spacer having a bottommost surface;
    a first dielectric material adjacent the fin and between the spacer and the gate structure, the first dielectric material having a first dielectric constant; and
    a second dielectric material in direct contact with the spacer and the first dielectric material and further in direct contact with the source region, the drain region, and the gate structure, the second dielectric material having a second dielectric constant that is lower than the first dielectric constant, and the second dielectric material having a bottommost surface co-planar with the bottommost surface of the spacer;
    wherein each of the spacers comprises a material that is different from the first and second dielectric materials.

13. The integrated circuit of claim 12, wherein the fin is a first fin, the integrated circuit further comprising:
    a second fin having a channel portion and a sub-channel portion;
    a second spacer adjacent and in contact with opposing sidewalls of the sub-channel portion of the second fin; and wherein the second dielectric material is between the spacer and the second spacer.

14. The integrated circuit of claim 12, wherein the semiconductor material of the fin comprises a group III-V semiconductor material and/or a group IV semiconductor material.

15. The integrated circuit of claim 12, wherein the semiconductor material of the fin is silicon and the spacer comprises silicon and nitrogen.

16. The integrated circuit of claim 12, wherein the source region and the drain region each comprise silicon and germanium.

17. An integrated circuit comprising:
a first fin comprising semiconductor material and having an upper portion and a lower portion;
a first gate structure adjacent and in contact with opposing sidewalls of the upper portion of the first fin, the first gate structure including a gate dielectric layer and a gate electrode;
a first spacer adjacent and in contact with opposing sidewalls of the lower portion of the first fin, the first spacer having a bottommost surface;
a second fin comprising semiconductor material and having an upper portion and a lower portion;
a second gate structure adjacent and in contact with opposing sidewalls of the upper portion of the second fin, the second gate structure including a gate dielectric layer and a gate electrode;
a second spacer adjacent and in contact with opposing sidewalls of the lower portion of the second fin, the second spacer having a bottommost surface; and
insulator fill material between the first spacer and the second spacer, the insulator fill material being distinct from the first and second spacers, and the insulator fill material having a bottommost surface co-planar with the bottommost surface of the first spacer and co-planar with the bottommost surface of the second spacer.

18. The integrated circuit of claim 17, wherein the insulator fill material comprises low-k dielectric material.

19. The integrated circuit of claim 17, wherein the first spacer does not directly contact the first gate structure, and the second spacer does not directly contact the second gate structure.

20. The integrated circuit of claim 17, further comprising:
a first source region and a first drain region, the upper portion of the first fin at least partially between the first source region and the first drain region; and;
a second source region and a second drain region, the upper portion of the second fin at least partially between the second source region and the second drain region.

21. An integrated circuit comprising:
a first fin comprising semiconductor material and having an upper portion and a lower portion;
a first spacer adjacent and in contact with opposing sidewalls of the lower portion of the first fin, the first spacer having a bottommost surface;
a second fin comprising semiconductor material and having an upper portion and a lower portion;
a second spacer adjacent and in contact with opposing sidewalls of the lower portion of the second fin, the second spacer having a bottommost surface; and
an insulation structure between the first spacer and the second spacer, the insulation structure being distinct from the first and second spacers, wherein the insulation structure comprises an air gap between the first semiconductor fin and the second semiconductor fin, and the insulation structure having a bottommost surface co-planar with the bottommost surface of the first spacer and co-planar with the bottommost surface of the second spacer.

22. An integrated circuit comprising:
a first fin comprising semiconductor material and having an upper portion and a lower portion;
a first spacer adjacent and in contact with opposing sidewalls of the lower portion of the first fin, the first spacer having a bottommost surface;
a second fin comprising semiconductor material and having an upper portion and a lower portion;
a second spacer adjacent and in contact with opposing sidewalls of the lower portion of the second fin, the second spacer having a bottommost surface; and
an insulation structure between the first spacer and the second spacer, the insulation structure being distinct from the first and second spacers, wherein the insulation structure comprises a first insulation material adjacent the first spacer and the second spacer, and a second insulation material adjacent the upper portion of the first fin and the upper portion of the second fin, wherein the second insulation material has a lower-k dielectric value than the first insulation material, and the insulation structure having a bottommost surface co-planar with the bottommost surface of the first spacer and co-planar with the bottommost surface of the second spacer.

23. An integrated circuit comprising:
a first fin comprising semiconductor material and having an upper portion and a lower portion;
a first spacer adjacent and in contact with opposing sidewalls of the lower portion of the first fin, the first spacer having a bottommost surface;
a second fin comprising semiconductor material and having an upper portion and a lower portion;
a second spacer adjacent and in contact with opposing sidewalls of the lower portion of the second fin, the second spacer having a bottommost surface;
an insulation structure between the first spacer and the second spacer, the insulation structure being distinct from the first and second spacers, and the insulation structure having a bottommost surface co-planar with the bottommost surface of the first spacer and co-planar with the bottommost surface of the second spacer;
a first gate structure over and in direct contact with the upper portion of the first fin, the first gate structure including a gate dielectric layer and a gate electrode;
a first source region adjacent to one side of the first gate structure, and a first drain region adjacent to an opposite side of the first gate structure;
a second gate structure over and in direct contact with the upper portion of the second fin, the second gate structure including a gate dielectric layer and a gate electrode; and
a second source region adjacent to one side of the second gate structure, and a second drain region adjacent to an opposite side of the second gate structure.

* * * * *